United States Patent
Hong et al.

(10) Patent No.: US 9,252,058 B2
(45) Date of Patent: Feb. 2, 2016

(54) SEMICONDUCTOR DEVICE AND METHOD OF FABRICATING THE SAME

(71) Applicant: Samsung Electronics Co., Ltd., Suwon-si (KR)

(72) Inventors: Hyung-Seok Hong, Ansan-si (KR); Sang-Jin Hyun, Suwon-si (KR); Hong-Bae Park, Incheon (KR); Hoon-Joo Na, Hwaseong-si (KR); Hye-Lan Lee, Hwaseong-si (KR)

(73) Assignee: SAMSUNG ELECTRONICS CO., LTD., Samsung-ro, Yeongtong-gu, Suwon-si Gyeonggi-do (KR)

( * ) Notice: Subject to any disclaimer, the term of this patent is extended or adjusted under 35 U.S.C. 154(b) by 0 days.

(21) Appl. No.: 14/308,745

(22) Filed: Jun. 19, 2014

(65) Prior Publication Data

US 2014/0302652 A1    Oct. 9, 2014

Related U.S. Application Data

(63) Continuation of application No. 13/445,667, filed on Apr. 12, 2012, now Pat. No. 8,786,028.

(30) Foreign Application Priority Data

May 17, 2011  (KR) .................. 10-2011-0046403
Aug. 31, 2011  (KR) .................. 10-2011-0088014

(51) Int. Cl.
*H01L 21/00* (2006.01)
*H01L 21/8234* (2006.01)
*H01L 21/84* (2006.01)
*H01L 27/12* (2006.01)

(Continued)

(52) U.S. Cl.
CPC .. *H01L 21/823437* (2013.01); *H01L 21/28008* (2013.01); *H01L 21/823431* (2013.01); *H01L 21/845* (2013.01); *H01L 27/1211* (2013.01); *H01L 29/66795* (2013.01)

(58) Field of Classification Search
CPC ............... H01L 21/823431; H01L 21/845; H01L 27/0886; H01L 27/0924; H01L 21/823821; H01L 27/10826; H01L 27/1211
USPC .......... 257/288, 368, 369; 438/151, 197, 199
See application file for complete search history.

(56) References Cited

U.S. PATENT DOCUMENTS

| | | | |
|---|---|---|---|
| 6,492,212 B1 | 12/2002 | Ieong et al. | |
| 7,514,753 B2 | 4/2009 | Tsuchiya et al. | |
| 8,187,928 B2 | 5/2012 | Yu et al. | |

(Continued)

FOREIGN PATENT DOCUMENTS

| KR | 10-2006-0038129 A | 5/2006 |
|---|---|---|
| KR | 10-2010-0079936 A | 7/2010 |

*Primary Examiner* — Jarrett Stark
*Assistant Examiner* — Shahed Ahmed
(74) *Attorney, Agent, or Firm* — Muir Patent Law, PLLC

(57) ABSTRACT

A method of manufacturing a semiconductor device, a semiconductor device and systems incorporating the same include transistors having a gate metal doped with impurities. An altered work function of the transistor may alter a threshold voltage of the transistor. In certain embodiments, a gate metal of a first MOSFET is doped with impurities. A gate metal of a second MOSFET may be left undoped, doped with the same impurities with a different concentration, and/or doped with different impurities. In some embodiments, the MOSFETs are FinFETs, and the doping may be a conformal doping.

20 Claims, 34 Drawing Sheets

(51) Int. Cl.
   *H01L 21/28*    (2006.01)
   *H01L 29/66*    (2006.01)

(56) References Cited

U.S. PATENT DOCUMENTS

2006/0244045 A1\* 11/2006 Visokay .......... H01L 21/823842
                                                              257/315
2007/0075351 A1\*  4/2007 Schulz ............ H01L 21/823821
                                                              257/314
2008/0142893 A1   6/2008 Hung et al.
2011/0294287 A1  12/2011 Lin et al.
2012/0074495 A1   3/2012 Ou et al.
2012/1019990      8/2012 Schulz et al.
2012/0256278 A1  10/2012 Zhang et al.
2012/0261726 A1  10/2012 Yang et al.

\* cited by examiner

SEMICONDUCTOR DEVICE AND METHOD OF FABRICATING THE SAME

This application is a continuation of and claims priority to U.S. patent application Ser. No. 13/445,667 filed on Apr. 12, 2012, which claims priority to Korean Patent Application No. 10-2011-0088014 filed on Aug. 31, 2011 in the Korean Intellectual Property Office and to Korean Patent Application No. 10-2011-0046403 filed on May 17, 2011 in the Korean Intellectual Property Office, the disclosure of each of which is incorporated herein by reference in its entirety.

BACKGROUND

1. Field of the Inventive concept

The present inventive concept relates to a semiconductor device and a method of manufacturing the same, as well as related systems and methods.

2. Description of the Related Art

Semiconductor devices have been developing to increase operation speed at a low voltage, and the semiconductor device fabrication process has been developing to increase the integration density of semiconductor devices.

The increased integration density, however, may result in problems. For example, increased integration density may cause a short-channel effect in field effect transistors (FETs) that are a type of semiconductor devices. Various designs have been developed to overcome this problem. For example, FinFETs in which a channel has a 3D spatial structure are being actively researched.

SUMMARY

Aspects of embodiments disclosed herein provide a method of fabricating a gate metal of a semiconductor device in which a work function of the gate metal is adjusted in a reliable manner.

Aspects of embodiments disclosed herein also provide a method of fabricating a semiconductor device in which a threshold voltage of a transistor is adjusted in a reliable manner.

Aspects of embodiments disclosed herein also provide a semiconductor device which includes transistors having different threshold voltages.

In some embodiments, a semiconductor device comprises:
a substrate;
a gate metal layer;
a first MOS field effect transistor (MOSFET) comprising:
 a first source at the substrate;
 a first drain at the substrate;
 a first channel at the substrate, the first channel being interposed between the first source and the first drain;
 a first gate comprising a first portion of the gate metal layer; and
 a first gate oxide interposed between the first gate and the first channel; and
a second MOSFET comprising:
 a second source at the substrate;
 a second drain at the substrate;
 a second channel at the substrate, the second channel being interposed between the second source and the second drain;
 a second gate comprising a second portion of the gate metal layer; and
 a second gate oxide interposed between the second gate and the second channel;
wherein the first gate comprises first dopants,
wherein the second gate comprises at least one of:
 (a) second dopants different from the first dopants,
 (b) first dopants at a different concentration than a concentration of dopants of the first gate material, and
 (c) no dopants,
wherein the first MOSFET and the second MOSFET are of the same conductivity type.

In some embodiments, a semiconductor device comprises:
a substrate;
a gate metal layer;
a first MOS field effect transistor (MOSFET) comprising:
 a first source at the substrate;
 a first drain at the substrate;
 a first channel at the substrate, the first channel being interposed between the first source and the first drain;
 a first gate comprising a first portion of the gate metal layer; and
 a first gate oxide interposed between the first gate and the first channel; and
a second MOSFET comprising:
 a second source at the substrate;
 a second drain at the substrate;
 a second channel at the substrate, the second channel being interposed between the second source and the second drain;
 a second gate comprising a second portion of the gate metal layer; and
 a second gate oxide interposed between the second gate and the second channel;
wherein the first gate material comprises first dopants causing the first gate material to have a first work function,
wherein the second gate material has a second work function different from the first work function, and
wherein the first MOSFET and the second MOSFET are of the same conductivity type.

In certain embodiments, the first and second transistors may have substantially the same size with different threshold voltages. In addition, may be formed of the same materials and only differ in the doping of their respective gate materials.

In certain embodiments, the first MOSFET and the second MOSFET may be of the same type (e.g., either N-type or P-type) and have the same channel length and channel width but have different threshold voltages.

In certain embodiments, the width of first gate is 20 nm or less and the width of the second gate is 20 nm or less.

In certain embodiments, the first MOSFET and the second MOSFET are FinFETs. The first gate of the first MOSFET may have a first doping profile at both a top surface of the first gate and a vertical surface of the first gate, and the second gate of the second MOSFET may have a second doping profile at both a top surface of the second gate and a second surface of the first gate, the second doping profile being different from the first doping profile. The first doping profile may comprise first dopants that are not elements of the second doping profile. Alternatively, or in addition, the first doping profile may comprise a peak doping concentration different from a peak doping concentration of the second doping profile.

In some embodiments, the first MOSFET and the second MOSFET may be FinFETs, and the first gate of the first MOSFET may have a first doping profile at both a top surface of the first gate and a vertical surface of the first gate, and second gate of the second MOSFET is undoped.

In some embodiments, a first group of MOSFETS may have substantially the same construction as the first MOSFET of the embodiments described herein, and a second group of MOSFETS may have substantially the same construction as the second MOSFET transistor of the embodiments described herein. Each of the first group of MOSFETs may be contained within a first well, and each of the second group of MOSFETs may be contained within a second well. Alternatively, each of the first group of MOSFETs and each of the second group of MOSFETs may be contained within a first well.

In some embodiments, other than a dopant difference of the first gate and the second gate, the first and second transistors are formed of the same materials. The dopant difference of the first gate and the second gate may include dopants in the first gate not present in the second gate. The dopant difference of the first gate and the second gate may include a doping concentration of the first gate not present in the second gate.

Other embodiments contemplate methods of manufacturing semiconductor devices such as the MOSFETs described herein and related devices.

BRIEF DESCRIPTION OF THE DRAWINGS

The above and other aspects will become more apparent by referencing the detailed description of the exemplary embodiments below with reference to the attached drawings, in which.

DETAILED DESCRIPTION OF THE EMBODIMENTS

Figure 1:
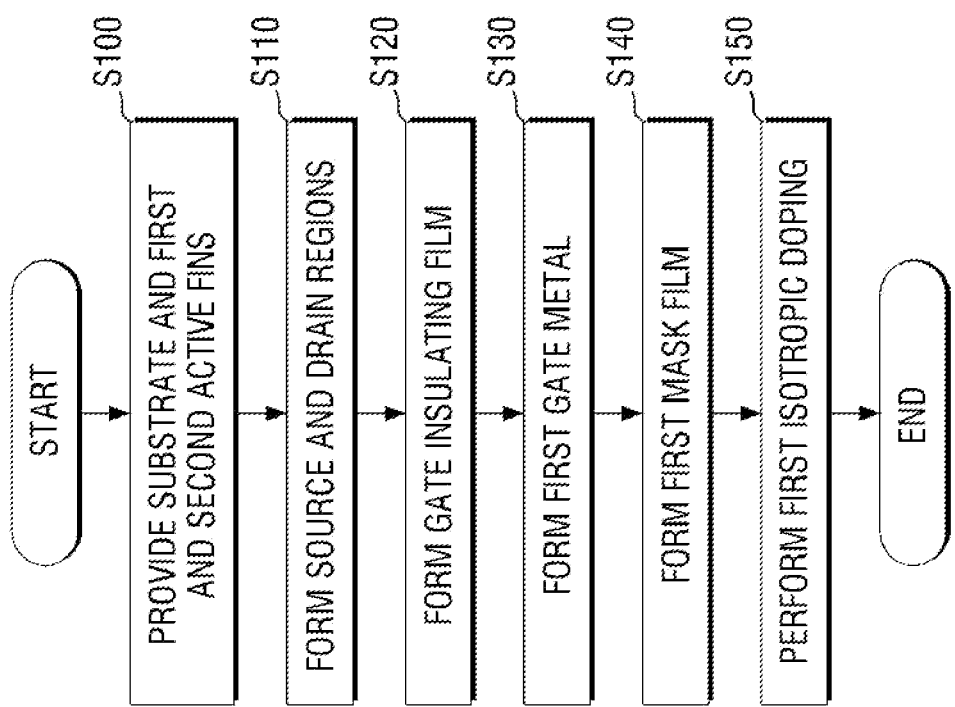
FIG. 1 is a flowchart illustrating a method of fabricating a semiconductor device according to an embodiment of the present inventive concept.

The present invention will now be described more fully hereinafter with reference to the accompanying drawings, in which preferred embodiments of the invention are shown. This invention may, however, be embodied in different forms and should not be construed as limited to the exemplary embodiments set forth herein. That is, the exemplary embodiments are just that —examples—many implementations and variations are possible that do not require the various details disclosed herein. The same reference numbers indicate the same components throughout the specification. In the attached figures, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" (and similar terms) are to be construed as open-ended terms (i.e., meaning "including, but not limited to,") unless otherwise noted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

Unless defined otherwise, all technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Throughout the specification, the term "film" may be used to denote a "layer," and the term "layer" may be used to denote a "film." That is, the term "film" may have the same meaning as the term "layer." "Layer" and "film" may denote a patterned layer/film which may include discontinuous elements of the layer/film (e.g., "layer" and "film" may refer to a patterned metal layer including a plurality of disconnected conductive lines, such as metal gate lines).

Hereinafter, a method of fabricating a semiconductor device according to an exemplary embodiment will be described with reference to FIGS. 1 through 15.

FIG. 1 is a flowchart illustrating a method of fabricating a semiconductor device according to an embodiment. FIGS. 2 through 15 are views illustrating intermediate processes included in the fabrication method of FIG. 1. FIGS. 9 and 11 are cross-sectional views taken along the lines A-A' and B-B' of FIGS. 8 and 10, respectively. FIGS. 13 and 15 are cross-sectional views taken along the lines C-C' and D-D' of FIGS. 12 and 14, respectively.

Figure 2:
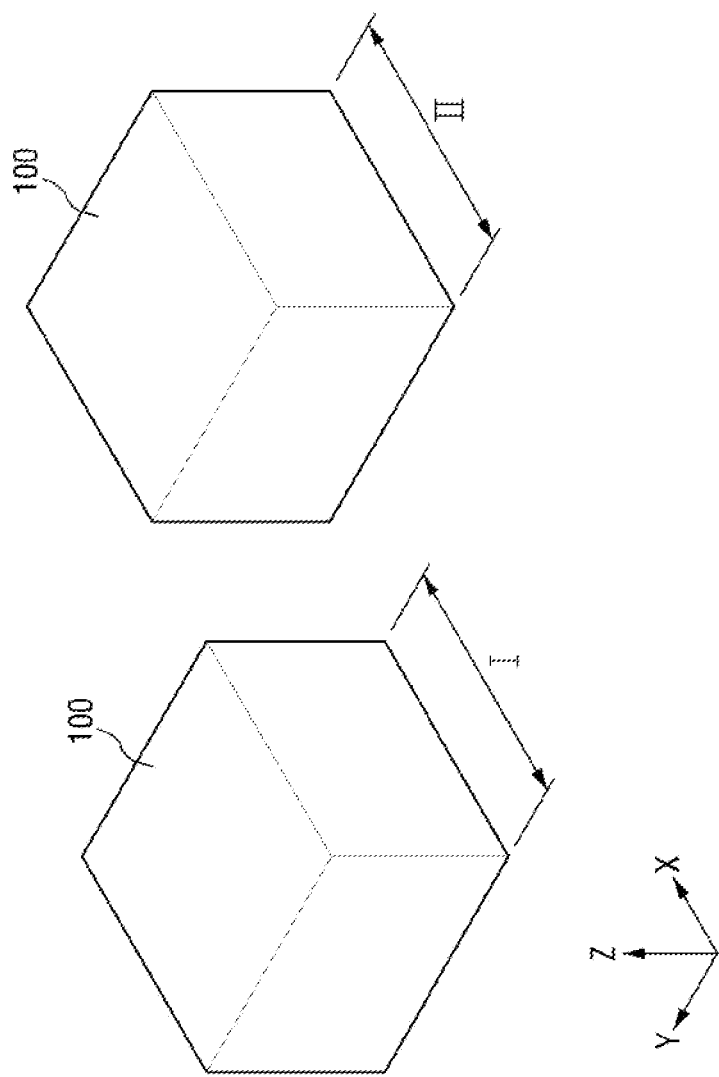
FIGS. 2 through 15 are views illustrating intermediate processes included in the fabrication method of FIG. 1.
Figure 3:
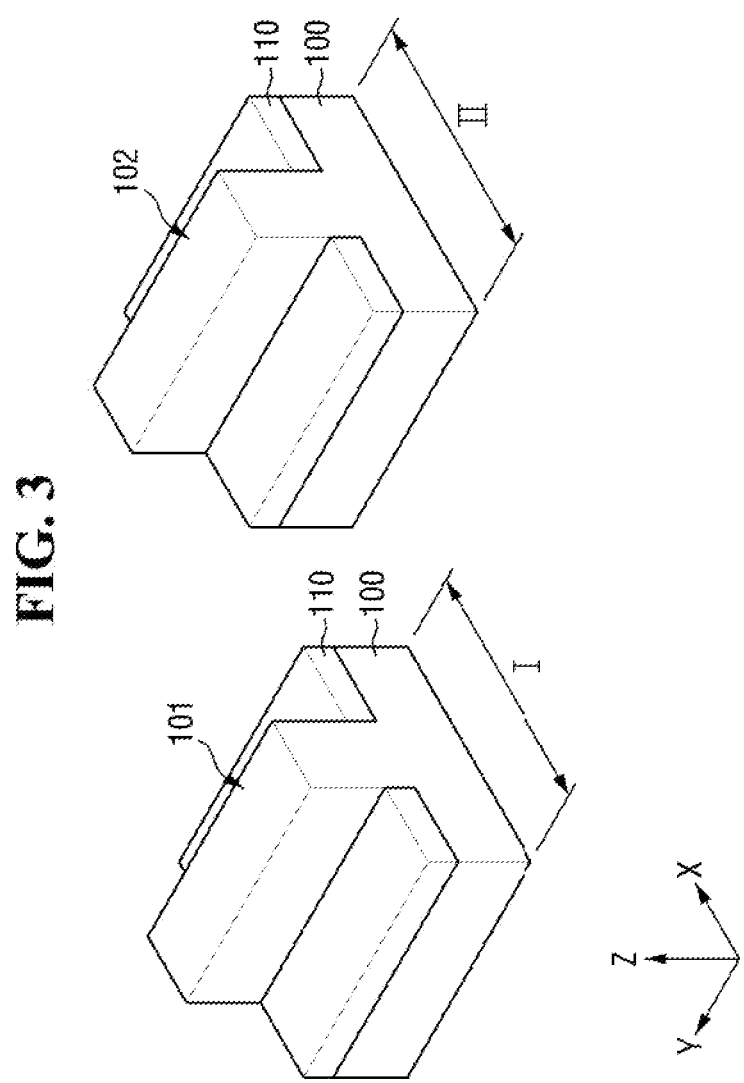

Referring to FIGS. 1 through 3, a substrate 100, and first and second active fins 101 and 102 are provided (operation S100). Specifically, the substrate 100 and the first and second active fins 101 and 102 which protrude at a top surface of the substrate 100 and are integrally formed on the substrate 100 are provided. Substrate 100 may be a crystalline substrate, such as formed from a crystalline wafer (e.g., silicon, germanium, silicon-germanium, gallium-arsenic). Substrate 100 may also be formed of a composite material, such as silicon on insulator. The first and second active fins 101 and 102 may be formed by etching into substrate 100 (e.g., etching grooves on both sides of fins 101 and 102 to define the fins. Alternatively, the first and second active fins 101 and 102 may be epitaxially grown from a top surface of substrate 100 (e.g., within a trench of an insulator (not shown) on the substrate, the trench exposing a top surface of substrate 100 and defining the shape of fins 101 and 102 (e.g., like a mold).

More specifically, referring to FIG. 2, the substrate 100 including a first region I and a second region II is prepared. The substrate 100 may be, for example, a Si substrate.

Referring to FIG. 3, a predetermined region of the substrate 100 is patterned to form the first and second active fins 101 and 102, which protrude at the top surface of the substrate 100 in a first direction (e.g., a Z direction) and are integrally formed with the remainder of substrate 100, in the first region I and the second region II, respectively. The first and second active fins 101 and 102 thus formed may extend in a second direction (e.g., a Y direction) as shown in the drawing. As will be described later, each of the first and second active fins 101 and 102 may function as a channel of a fin field effect transistor (FinFET) that is to be formed.

After the first and second active fins 101 and 102 are formed, an element isolation film 110 may be formed on both sides of each of the first and second active fins 101 and 102. The element isolation film 110 may be made of, e.g., SiOx. As shown in the drawing, the element isolation film 110 may extend in the second direction (e.g., the Y direction).

Figure 4:
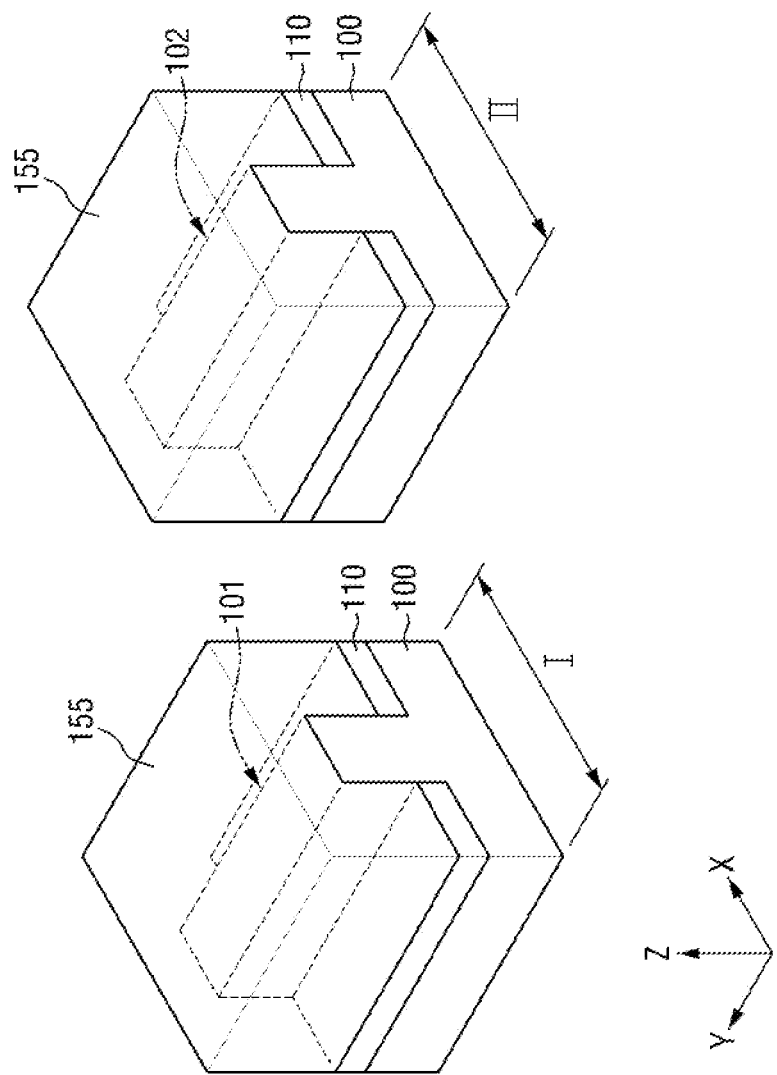
Figure 5:
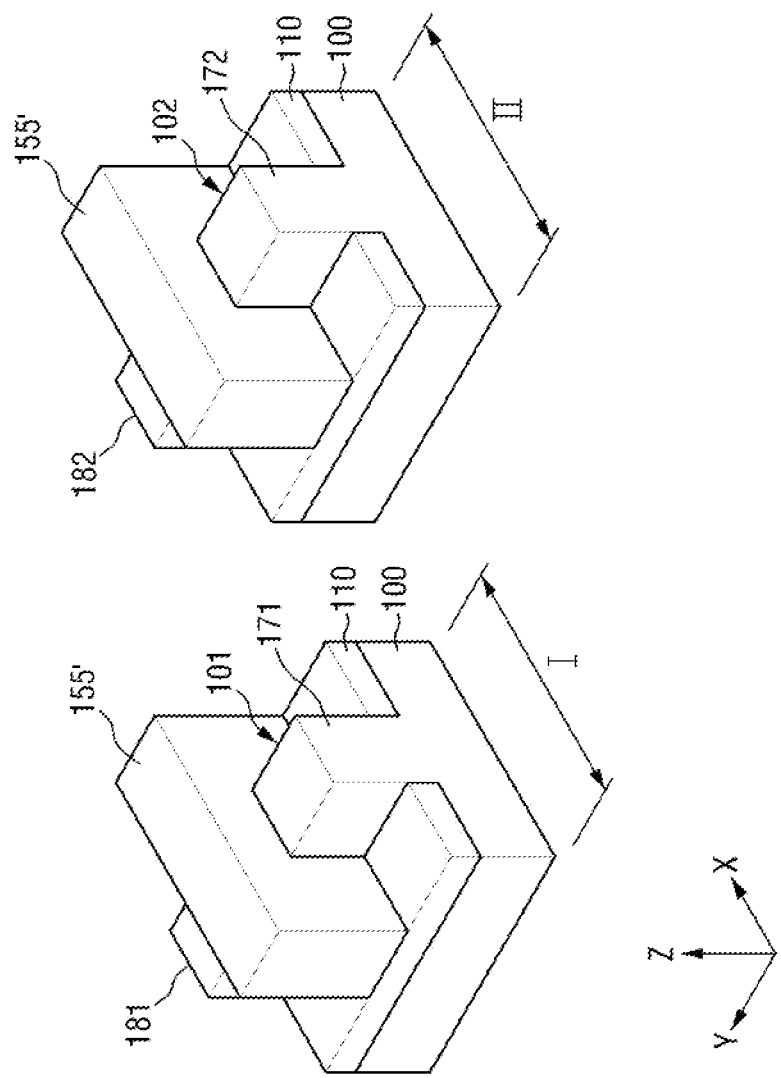

Referring to FIGS. 1, 4 and 5, source and drain regions are formed on the substrate 100 (operation S110). Specifically, before the formation of a gate metal, a first source region 171 and a first drain region 181 may be formed in both sides of the first active fin 101, and a second source region 172 and a second drain region 182 may be formed in both sides of the second active fin 102.

More specifically, referring to FIG. 4, a dummy gate film 155 is formed on the substrate 100 to completely cover the first and second active fins 101 and 102. Optionally, although not shown in the drawing, an etch stop film (not shown) may be formed on the first and second active fins 101 and 102, and then the dummy gate film 155 may be formed to completely cover the first and second active fins 101 and 102 and the etch stop film (not shown).

Referring to FIG. 5, the dummy gate film 155 is etched to form dummy gates 155' and to expose portions of the first and second active fins 101 and 102 in which the first and second source regions 171 and 172 and the first and second drain regions 181 and 182 are to be formed. Then, N- or P-type impurities are implanted into the exposed portions of the first and second active fins 101 and 102, thereby forming the first and second source regions 171 and 172 and the first and second drain regions 181 and 182. More specifically, the first source region 171 and the first drain region 181 may be formed in the first active fin 101 disposed on the first region I of the substrate 100, and the second source region 172 and the second drain region 182 may be formed in the second active fin 102 disposed on the second region II of the substrate 100.

Figure 6:
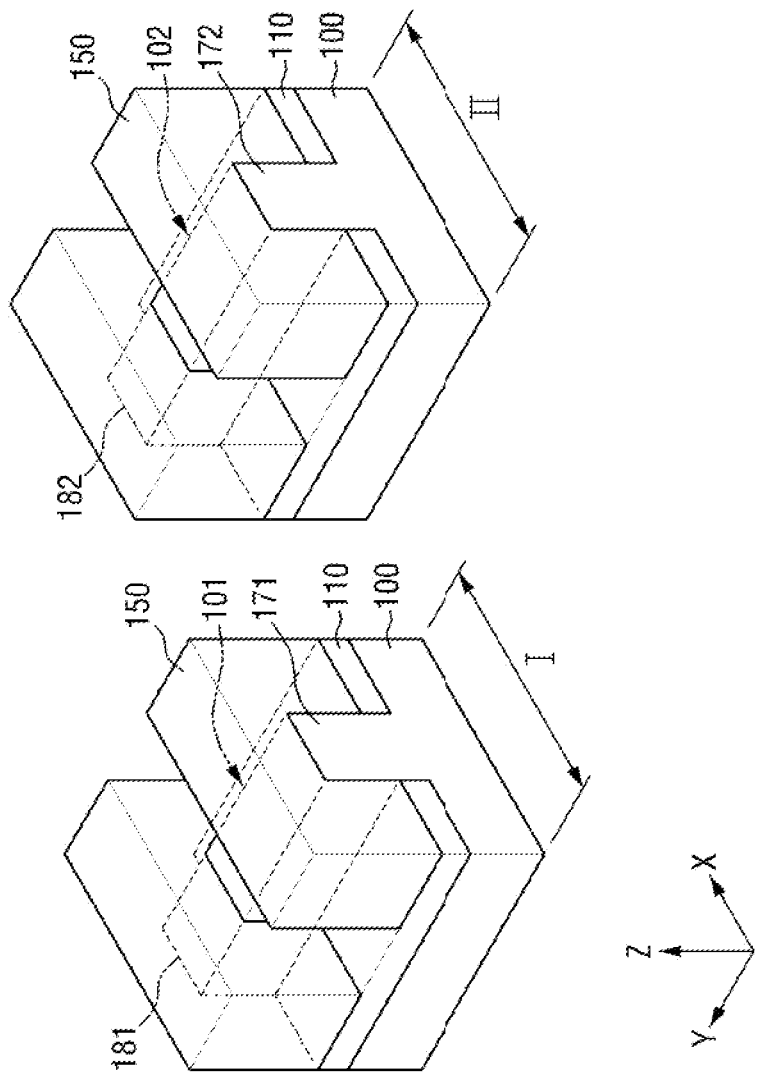
Figure 7:
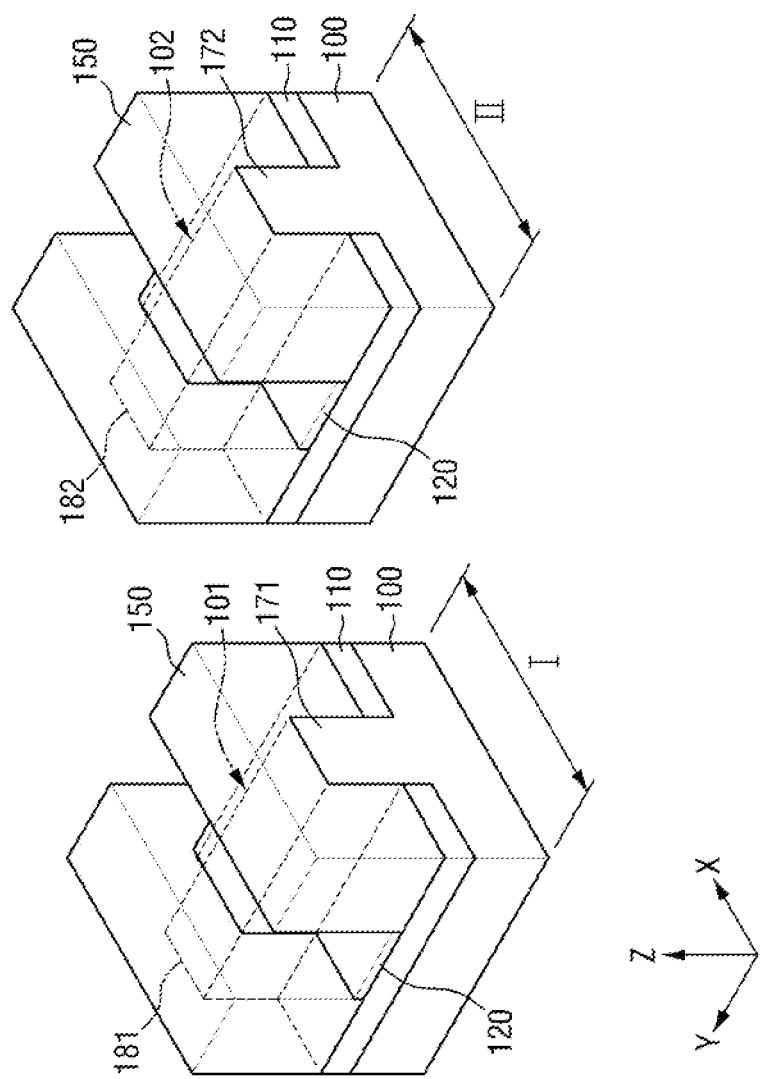

Referring to FIG. 6, the dummy gates 155' may be removed from the first and second active fins 101 and 102, e.g., with etching process (e.g., wet etch). Referring to FIGS. 1 and 7, a gate insulating film 120 may optionally be formed (operation S120). Specifically, the gate insulating film 120 may be formed on the substrate 100 and the first and second active fins 101 and 102 which protrude from the substrate 100.

More specifically, referring to FIG. 6, an interlayer insulating film 150 is formed on the substrate 100 having the dummy gates 155' (see FIG. 5). Then, the dummy gate film 155 (see FIG. 5) is removed by selective etching so as to expose a predetermined region of the substrate 100 on which a gate metal (not shown) is to be formed. The selective etching may be preceded by a chemical mechanical polishing or other etch to remove portions of the interlayer insulating film 150 formed over dummy gates 155' to expose dummy gates 155'. Exposure of dummy gates 155' may facilitate the subsequent selective etching may to remove dummy gates 155'

Referring to FIG. 7, the gate insulating film 120 is formed. The gate insulating film 120 may be formed to extend in a third direction (e.g., an X direction) intersecting the second direct (e.g., Y direction) in which the first and second active fins 101 and 102 extend in the second direction. The gate insulating film 120 may be formed on both side surfaces and a top surface of each active fin 101 and 102 at portions that are exposed by interlayer insulating film 150 (e.g., where dummy gate 155' previously was formed).

The gate insulating film 120 may be a high-k dielectric film. The material that forms the gate insulating film 120 may be, for example, metal-oxide that contains Hf or Zr, metal-oxide-nitride that contains Hf or Zr, or the above materials doped with Ti, Ta, Al or a lanthanide. The high-k layer also may be selected from a group comprising of aluminum oxide ($Al_2O_3$), hafnium oxynitride (HfON), hafnium silicate (Hf-SiO4), zirconium oxide ($ZrO_2$), zirconium oxynitride (ZrON), zirconium silicate (ZrSiO4), $Ta_2O_5$, $Y_2O_3$, $Nb_2O_5$, $TiO_2$, $CeO_2$, $In_2O_3$, $RuO_2$, MgO, SrO, $B_2O_3$, $SnO_2$, PbO, $PbO_2$, $Pb_3O_4$, $V_2O_3$, $La_2O_3$, $Pr_2O_3$, $Sb_2O_3$, $Sb_2O_3$, $Sb_2O_5$, CaO, etc., or combinations thereof. The high-k dielectric preferably may have a dielectric constant of 6 or greater. Alternatively, the high-k dielectric may have a dielectric constant of 8 or greater, larger than 10, or larger than 20. The high-k dielectric film 120 may be formed by chemical vapor deposition (CVD) or atomic layer deposition (ALD). The ALD process sequentially applies precursor materials (e.g., a hafnium source precursor and an oxygen source precursor) separated by a purging step. For example, a source gas based on a metal component, such as Hf, Zr, Al, Ti, La, Y, Gd or Ta, is deposited onto substrate 100. Thereafter, a purge gas is injected to remove unreacted gas remaining in the source gas. For example, argon (Ar) or nitrogen gas may be used as the purge gas. Next, a reaction gas is injected to react with the metal source gas to form a high-k dielectric layer. For example, ozone ($O_3$), plasma oxygen, or water vapor ($H_2O$) may be used as the reaction gas.

Alternatively, gate insulating film 120 may be $SiO_2$. The gate insulator may be grown with a thermal growth process, (e.g., a thermal oxide growth process).

Figure 8:
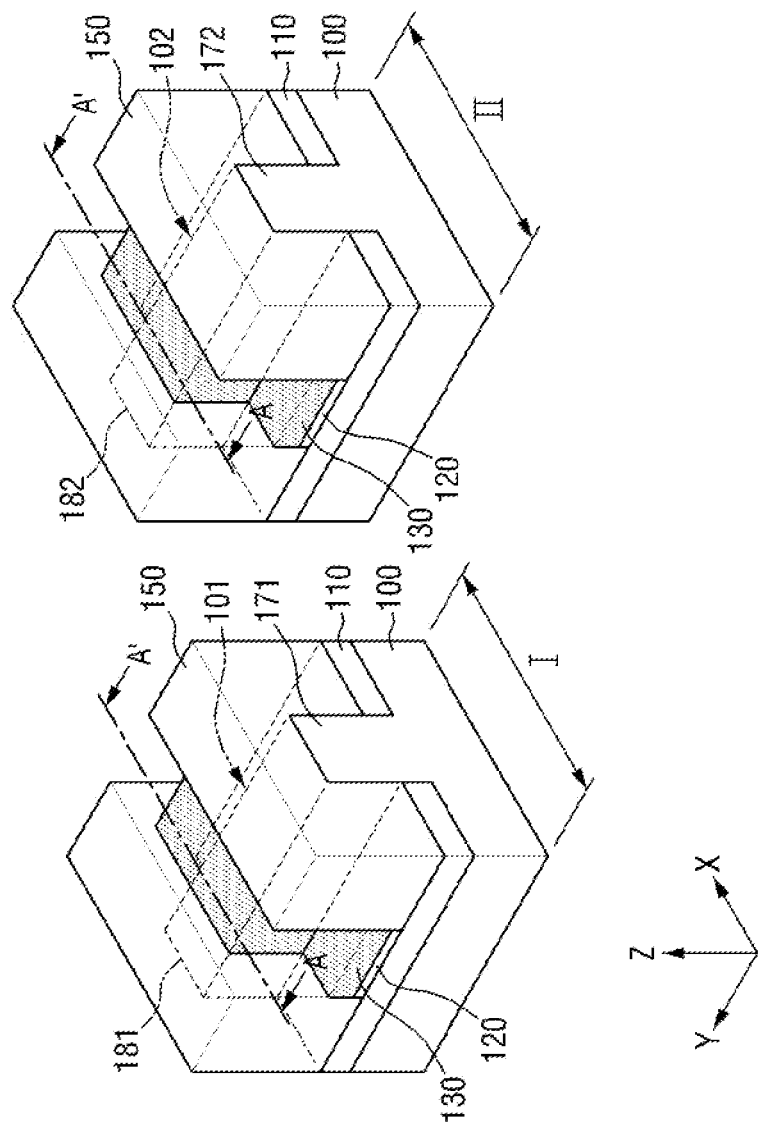
Figure 9:
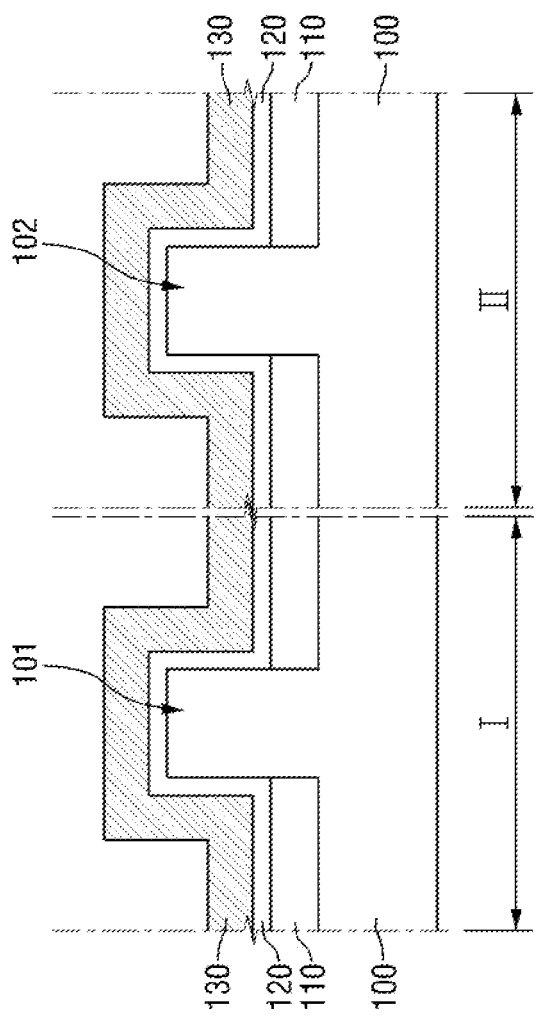

Referring to FIGS. 1, 8 and 9, a first gate metal 130 is formed (operation S130). Specifically, the first gate metal 130 having a first work function may be formed on each of the first and second active fins 101 and 102. As is known, the work function of a material may be the minimum energy (usually measured in electron volts) needed to remove an electron from the material to a point immediately outside the sold surface).

More specifically, referring to FIGS. 8 and 9, the first gate metal 130 may be formed on each of the first region I and the second region II of the substrate 100 to contact the gate insulating film 120. The first gate metal 130 may extend in the third direction (e.g., the X direction). As shown in the drawings, the first gate metal 130 may be conformally formed along top and side surfaces of each of the first and second active fins 101 and 102. Accordingly, a channel having a width extending in a horizontal direction (e.g., the X direction) and a vertical direction (e.g., the Z direction) may be formed in each of the first and second active fins 101 and 102 (e.g., the channel width for each channel may extend up a side surface of the gate oxide (Z direction) across a top surface of the gate oxide (X direction) and down the opposite side surface (direction opposite to Z direction)). In some embodiments, the height of the fin (in the Z direction) may be the same or larger than the width of the top of the fin (taken in the X direction) (e.g., the height of the fin may be range between 1.0 and 1.3 times or between 1.0 and 1.2 times as large as the width of the top of the fin). The length of each channel may have a length extending in a horizontal direction (e.g., Y direction). In some embodiments, the length of each channel may be 20 nm or less.

The first gate metal 130 according to the current embodiment may have the first work function. The material that forms the first gate metal 130 may be, but is not limited to, any one of metal, metal-carbide, metal-nitride, metal-silicide, and metal-silicon-nitride materials. The gate metal 130 may be formed of multiple layers of different gate materials (e.g., a stack of materials).

Figure 10:
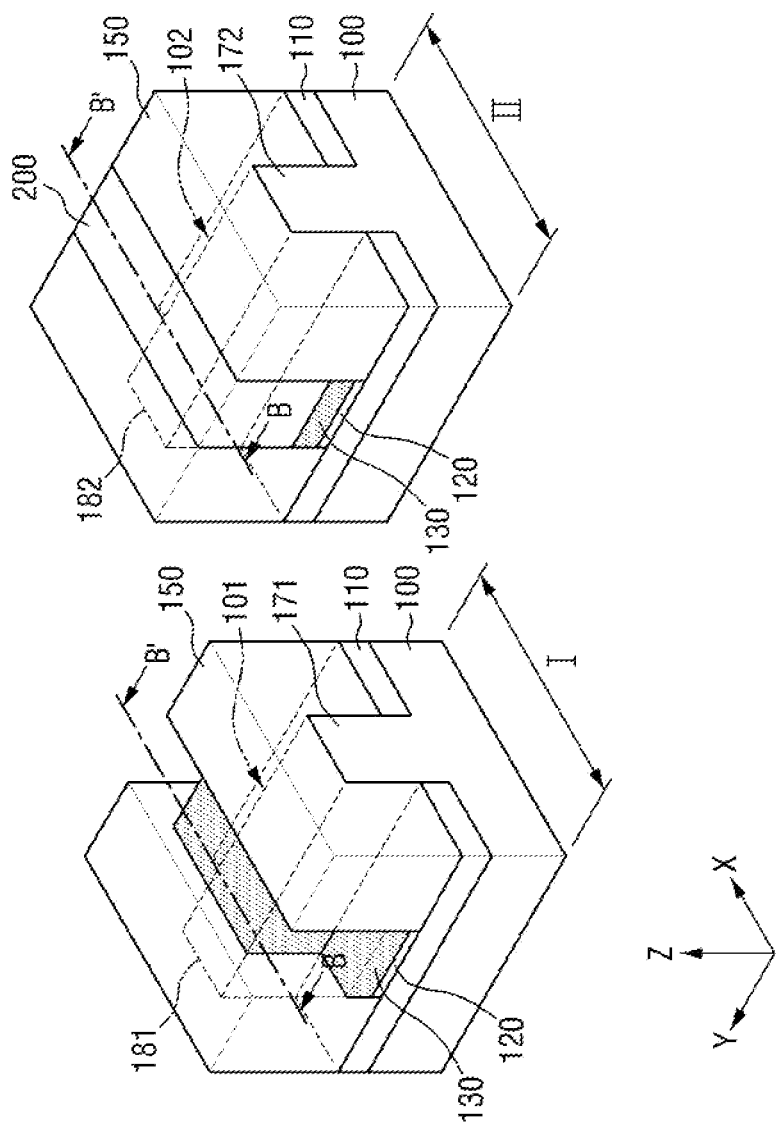
Figure 11:
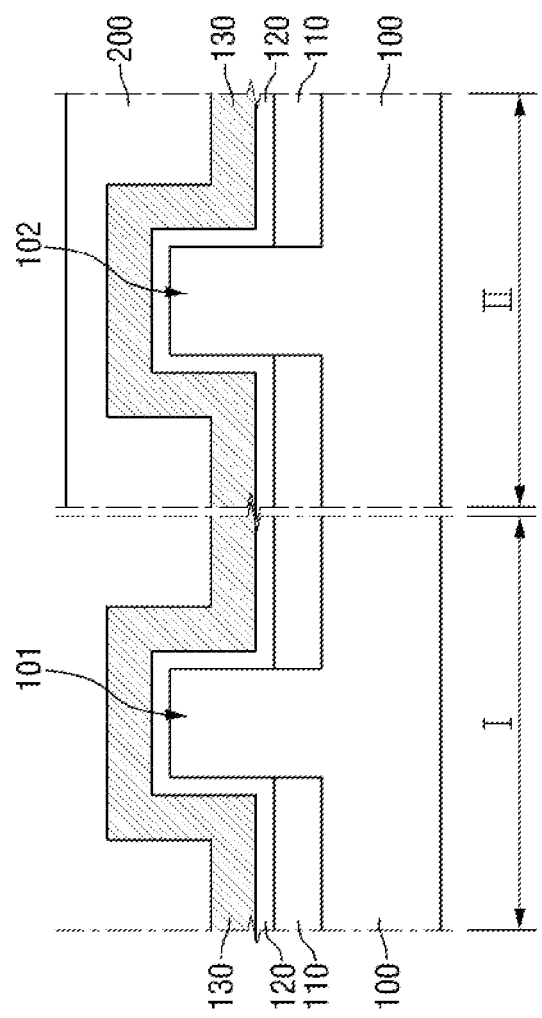

Referring to FIGS. 1, 10 and 11, a first mask film 200 is formed (operation S140). Specifically, the first mask film 200 may be formed such that the first gate metal 130 on the first active fin 101 formed on the first region I of the substrate 100 is exposed.

More specifically, referring to FIGS. 10 and 11, the first mask film 200 may be formed to expose the first gate metal 130 on the first active fin 101 formed on the first region I of the substrate 100 and to cover the first gate metal 130 on the second active fin 102 formed on the second region II of the substrate 100. Here, the first mask film 200 may be formed to a thickness that makes impurities unable to pass through (or to reduce an amount of the impurities that pass through) the first mask film 200 in a doping process which will be described later.

Referring to FIGS. 1 and 12 through 15, a first isotropic doping process is performed (operation S150). Specifically, the first isotropic doping process for doping first impurities W1 is performed to transform the first gate metal 130 on the first active fin 101 into a second gate metal 140 having a second work function which is different from the first work function.

Figure 12:
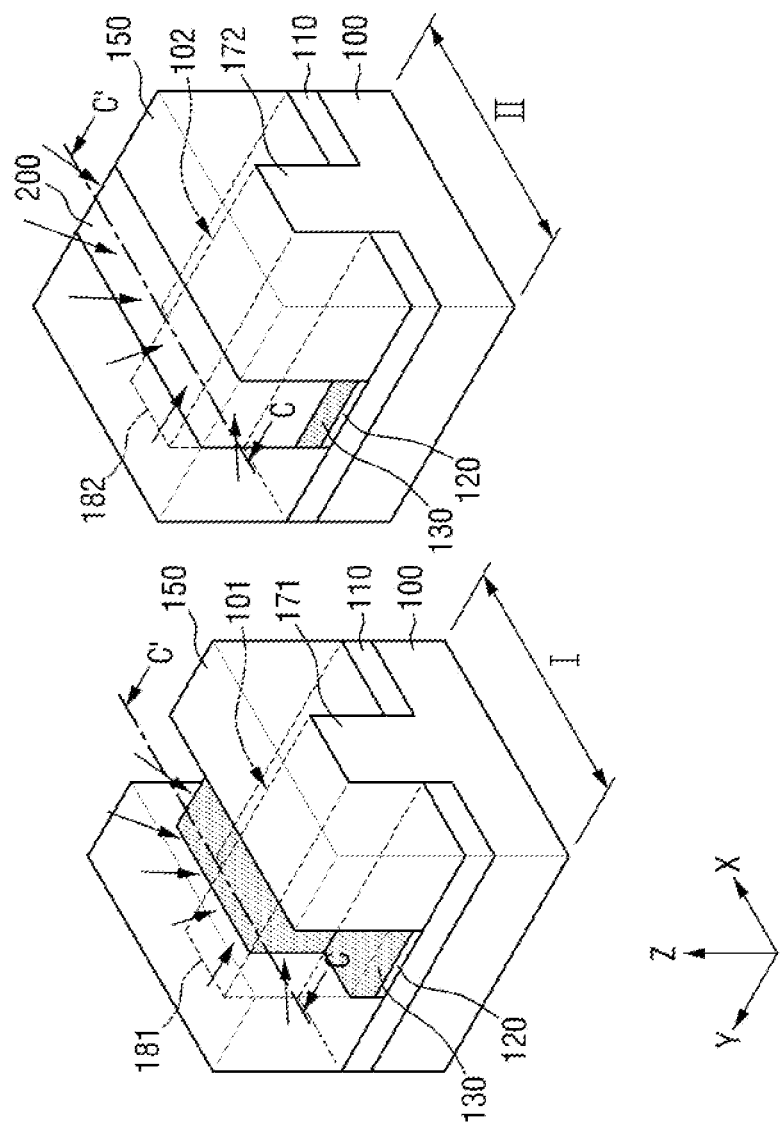
Figure 13:
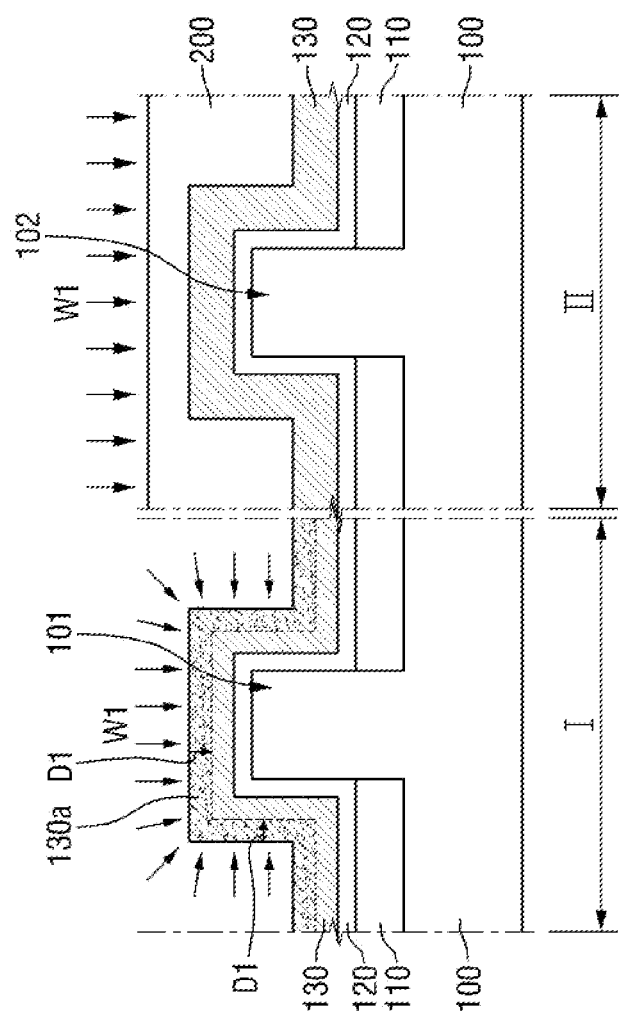

More specifically, referring to FIGS. 12 and 13, the first isotropic doping process is performed on the first region I and the second region II of the substrate 100. Here, since the first gate metal 130 formed on the first region I of the substrate 100 is exposed by the first mask film 200 and the first gate metal 130 formed on the second region II of the substrate 100 is covered with the first mask film 200, only the first gate metal 130 formed on the first region I of the substrate 100 is doped with the first impurities W1. That is, the first mask film 200 protects the first gate metal 130 formed on the second region II of the substrate 100 from the first impurities W1. Alternatively, the thickness of the first mask film 200 may allow a reduced amount (as compared to that doped in the first gate metal 130 in the first region I) of the first impurities W1 to pass through to the second gate metal 130 in the second region II. The reduced amount of first impurities W1 implanted into the second gate metal 130 in the second region II may be less than 10% or less than 50%, e.g., than that amount of first impurities W1 implanted in the first gate metal formed in the first region I.

The first isotropic doping process may be a process of doping the first impurities W1 into the entire surface of the first gate metal 130 on the first active fin 101, including side surfaces and top surface of the first gate metal 130 on the first active fin 101. Specifically, the first isotropic doping process may be a process of doping the first gate metal 130 on the first active fin 101 with the first impurities W1 such that a doping profile 103a of the first impurities W1 within the first gate metal 130 is conformally formed along a profile of the first gate metal 130 as shown in FIG. 13.

After the first isotropic doping process, a doping depth D1 of the first impurities W1 which is measured from the surface of the first gate metal 130 on the top surface of the first active fin 101 may be equal to (or differ less than 10%, or less than 20%, to) a doping depth D1 of the first impurities W1 which is measured from the surface of the first gate metal 130 formed on the side surfaces of the first active fin 101. A doping profile of the first impurities on the side surfaces of the first gate metal 130 of the first active fin and a doping profile of the first impurities on the top surface of the first gate metal 130 of the first active fin may be substantially the same. A peak doping concentration of the first impurities at locations on the side surfaces of the first gate metal 130 of the first active fin and a peak doping concentration of the first impurities at a location on the top surface of the first gate metal 130 of the first active fin may be substantially the same (e.g., vary within 10% or 20% of each other). The peak doping concentration may be the maximum doping concentration of a doping profile taken from a surface of the first gate metal 130 into the volume of the first gate metal 130.

In some embodiments, the first isotropic doping process may be a plasma doping process in which the first gate metal 130 on the first active fin 101 is doped using a plasma gas that contains the first impurities W1. The plasma doping process may include a process of generating a plasma gas, which contains the first impurities W1, at a power of 100 W to 100 KW, a standard atmospheric pressure of 760 Torr or less and a flow rate of 1,000 to 10,000 SLM and a process of doping the entire surface of the exposed first gate metal 130 with the first impurities W1 contained in the plasma gas at a bias of 100 KeV or less.

Specifically, in the process of generating a plasma gas, a plasma chamber may be maintained under a power condition of 100 W to 100 KW in order to adjust a dose of the first impurities W1 in the plasma gas. That is, the chamber maintained at a power of 100 W or higher may allow the first impurities W1 to be properly introduced into the plasma gas. In addition, the chamber maintained at a power of 100 KW or less may prevent the first impurities W1 from being introduced into the plasma gas at an excessively high concentration. As a result, doping characteristics of the first gate metal 130 can be improved.

Also, the plasma chamber may be maintained at a standard atmospheric pressure of 760 Torr or less, and the flow rate of the plasma gas is maintained at 1,000 to 10,000 SLM. Accordingly, the concentration of the first impurities W1 in the plasma gas can be adjusted to a concentration that can change the work function of the first gate metal 130.

A bias of 100 KeV or less is applied to the plasma gas generated as described above, such that the first impurities W1 contained in the plasma gas are doped into the exposed first gate metal 130. In the current embodiment, the bias condition is maintained at 100 KeV or less to prevent the surface of the exposed first gate metal 130 from being damaged during the doping process.

The first impurities W1 may contain any one of B, As, P, Si, Ge, Ar, He, and Xe, and the plasma gas used in the plasma doping process may also contain any one of the above materials. As will be described later, the first impurities W1 change the work function of the first gate metal 130 formed on the first region I of the substrate 100.

In some embodiments, the first isotropic doping process may include uniformly ion-implanting the entire surface of the first gate metal 130 with the first impurities W1 by varying an implantation angle of the first impurities W1.

Figure 14:
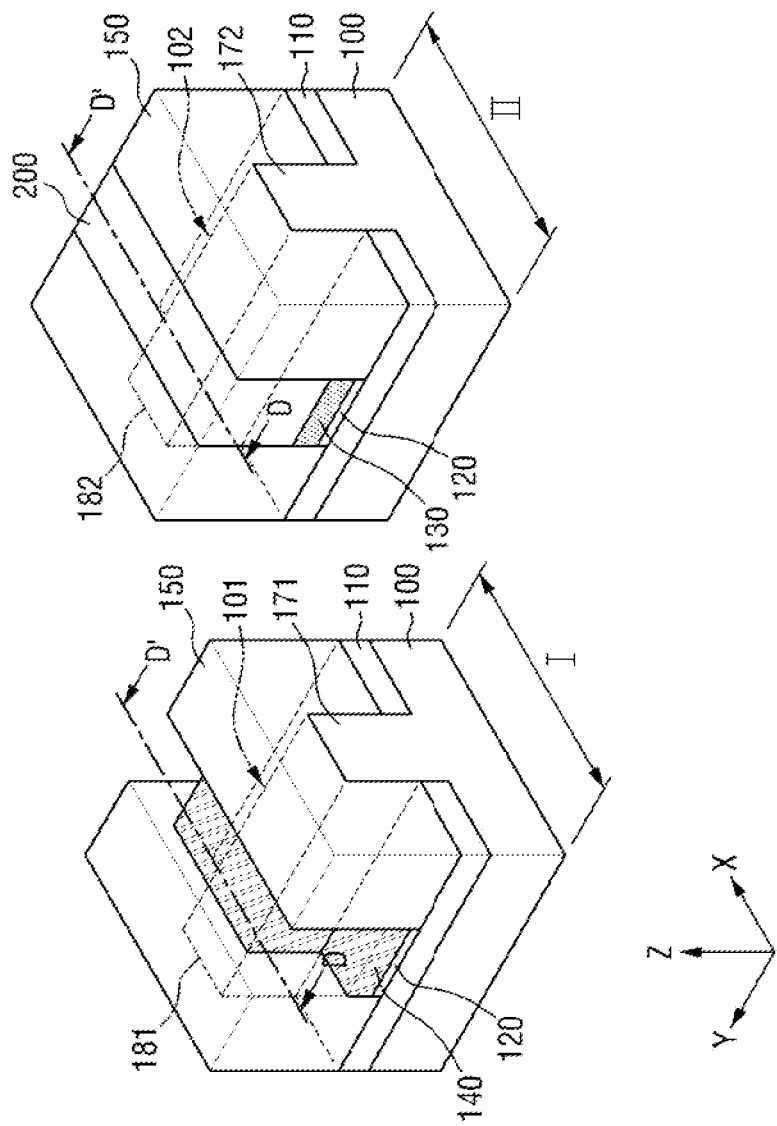
Figure 15:
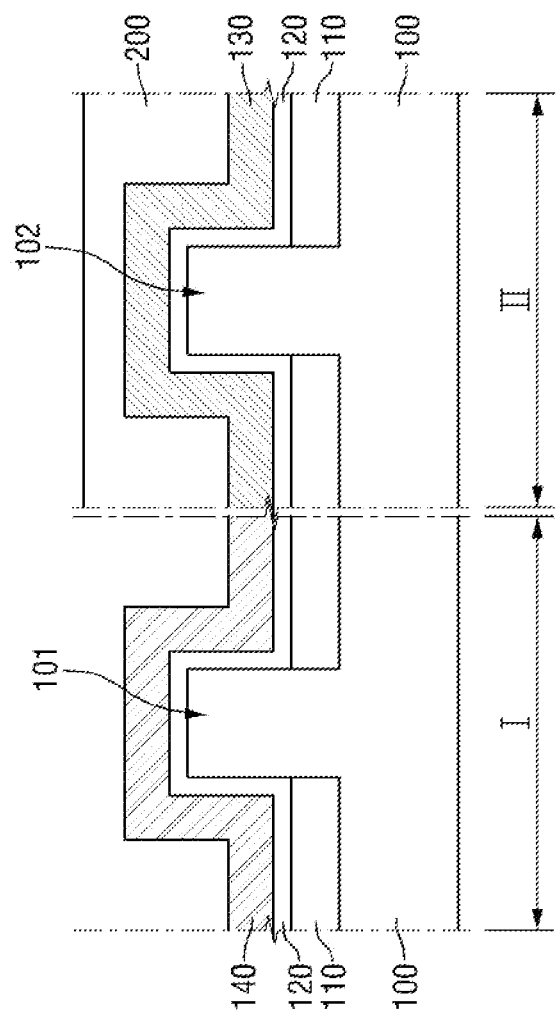

Referring to FIGS. 14 and 15, as a result of the first isotropic doping process, the second gate metal 140 having the second work function is formed on the first region I of the substrate 100, whereas the first gate metal 130 having the first work function remains intact on the second region II of the substrate 100. Alternatively, if a reduced amount of impurities W1 passes through the first mask film 200 (as compared to that doped in the first gate metal 130 in the first region I) the first gate metal 130 may have a work function different (possibly just slightly different) than the first work function. For ease of communication, the following describes the first gate metal 130 as maintaining its first work function, but alternatives to this embodiment and other embodiments described herein contemplate that the first gate metal 130 may also be doped with a reduced amount of impurities W1 and the associated first work function of the first gate metal 130 may be altered. Here, a threshold voltage of a first transistor including the first active fin 101, the first source region 171, the first drain region 181, the gate insulating film 120 on the first active fin 101, and the second gate metal 140 may be different from a threshold voltage of a second transistor including the second active fin 102, the second source region 172, the second drain region 182, the gate insulating film 120 on the second active fin 102, and the first gate metal 130. The first and second transistors may have different threshold voltages even though their structure only differs due in the different doping of their gate metals. For example, the first and second transistors (having different threshold voltages) may be of the same type (either both N-type or both P-type) have the same size (e.g., same channel length, same channel width, same gate oxide thickness, same layer materials, etc.) and differ only the doping of the gate metals (either in concentration amounts or different type of dopants or one gate metal being doped and the other gate metal being undoped). As will be recognized by one of ordinary skill, as used in this application, "same size" or other use of "same" ore "equal" when relating dimensions allows for variations due to manufacturing process variations. For example, even if transistors are designed to be the same size, process variations (e.g., due to different locations on a wafer, different heights during a process step (e.g., due to "dishing" during a previous CMP step), or due to other non-uniform process conditions) may lead to slight but acceptable deviations in one or more dimensions of the transistor structure. The different threshold voltages may result from the second gate metal 140 formed by the first isotropic process having a different work function from that of the first gate metal 130 as described above.

Therefore, the semiconductor device according to the current embodiment may include the first and second transistors having different threshold voltages. The first and second transistors according to the current embodiment may be, for example, n-channel metal oxide semiconductor (NMOS) transistors. In this case, the first and second source regions 171 and 172 and the first and second drain regions 181 and 182 may contain N-type impurities.

In the first isotropic doping process described above, impurities are not excessively doped into a certain surface (e.g., a top or side surface) of the first gate metal 130 formed on the first active fin 101. Instead, the entire surface of the first gate metal 130 is uniformly doped with impurities. This may be helpful to adjust work function of the first gate metal 130 in a reliable manner. On the other hand, if the first gate metal 130 is locally implanted or locally doped with impurities (e.g., only at a particular portion of the first gate metal 130), it may be difficult to make the entire first gate metal 130 to have a desired work function. It should be emphasized that the isotropic doping and/or conformal doping process of just a single transistor (whether or not to vary a work function with respect to another transistor) is within the scope of this invention. However, the invention is not limited to isotropic and/or conformal doping as described above—other doping processes may be employed and other mechanisms other than doping may be used to alter a work function of a transistor.

Hereinafter, a method of fabricating a semiconductor device according to another embodiment will be described with reference to FIGS. 2 through 23.

Figure 16:
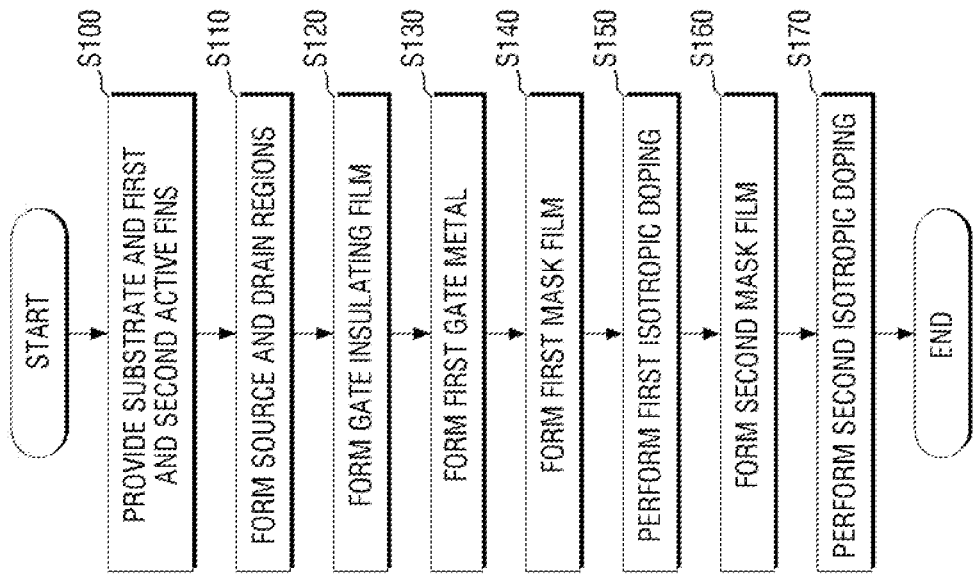
FIG. 16 is a flowchart illustrating a method of fabricating a semiconductor device according to another embodiment of the present inventive concept.

FIG. 16 is a flowchart illustrating a method of fabricating a semiconductor device according to another embodiment. FIGS. 17 through 23 are views illustrating intermediate processes included in the fabrication method of FIG. 16. Here, FIGS. 19, 21 and 23 are cross-sectional views taken along the lines E-E', F-F' and G-G' of FIGS. 18, 20 and 22, respectively.

Referring to FIGS. 2 through 16, a substrate 100 and first and second active fins 101 and 102 are provided (operation S100). Source and drain regions 171, 172, 181 and 182 are formed on the substrate 100 (operation S110), and a gate insulating film 120 and a first gate metal 130 are formed (operations S120 and S130). Then, a first mask film 200 is formed to expose the first gate metal 130 on the first active fin 101 and cover the first gate metal 130 on the second active fin 102 (operation S140). After the formation of the first mask film 200, a first isotropic doping process for doping first impurities W1 is performed, thereby transforming the first gate metal 130 on the first active fin 101 into a second gate metal 140 (operation S150). This process has been described above in detail, and thus a repetitive description thereof will be omitted.

Referring to FIGS. 16 through 19, a second mask film 210 is formed (operation S160). Specifically, after the first mask film 200 (see FIG. 14) is removed, the second mask film 210 may be formed to cover the second gate metal 140 on the first active fin 101 and expose the first gate metal 130 on the second active fin 102.

Figure 17:
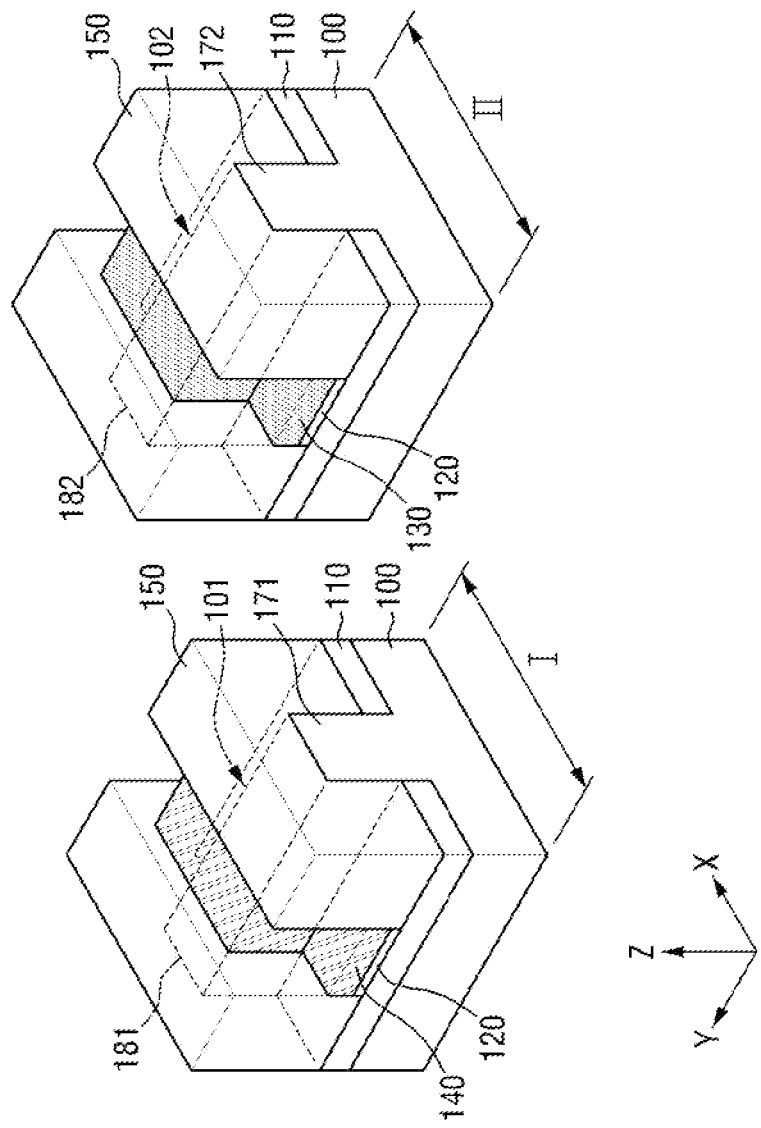
FIGS. 17 through 23 are views illustrating intermediate processes included in the fabrication method of FIG. 16.

More specifically, referring to FIG. 17, the first mask film 200 (see FIG. 14) formed on a second region II of the substrate 100 is removed. Here, the first mask film 200 (see FIG. 14) may be removed using various known methods (e.g., selective etching).

Figure 18:
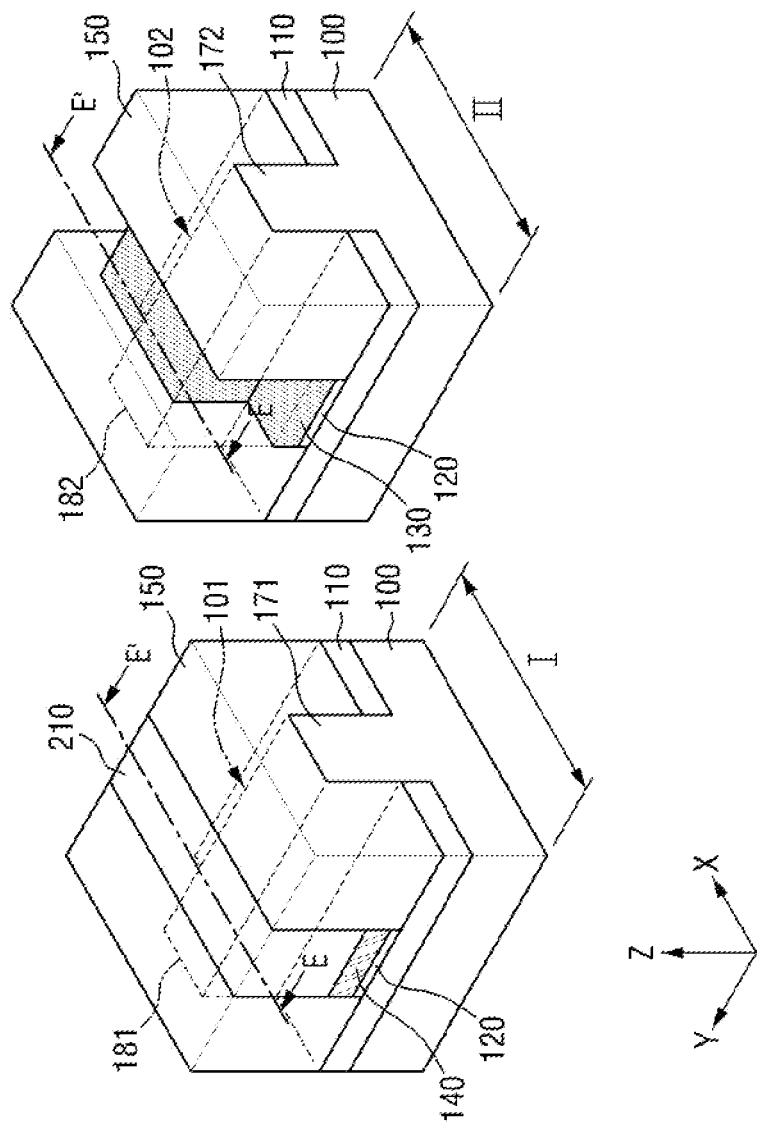
Figure 19:
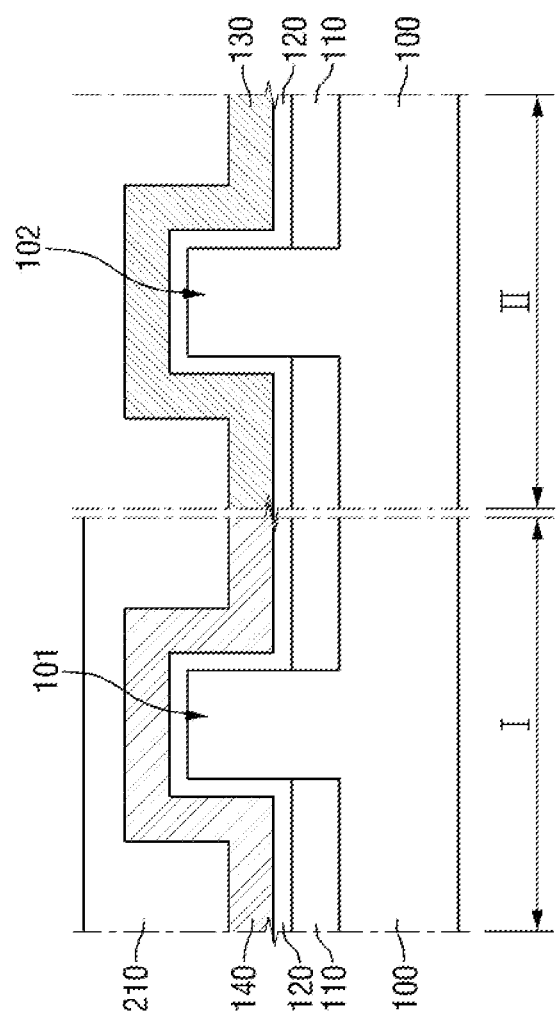

Referring to FIGS. 18 and 19, the second mask film 210 is formed on a first region I of the substrate 100. Specifically, the second mask film 210 may be formed to cover the second gate metal 140 on the first active fin 101 formed on the first region I of the substrate 100 and to expose the first gate metal 130 on the second active fin 102 formed on the second region II of the substrate 100. The second mask film 210 may be formed in a manner similar to forming the first mask film 200. Like the first mask film 200 (see FIG. 14) described above, the second mask film 210 may be formed to a thickness that makes impurities unable to pass through the second mask film 210 in a doping process which will be described later. Alternatively, the second mask film 210 may be formed to a thickness that reduces an amount of impurities that pass through the second mask film in a subsequent doping process (such as less than 50% or less than 10% of the amount of impurities that are implanted in the first gate metal in the subsequent doping process). For ease of communication, the following describes the second gate metal 140 as maintaining its work function after the subsequent doping process, but alternatives to this embodiment and other embodiments described herein contemplate that the second gate metal 140 may also be doped with a reduced amount of impurities and the associated work function of the second gate metal 130 may be altered with this doping process.

Referring to FIGS. 16 and 20 through 23, a second isotropic process is performed (operation S170). Specifically, the second isotropic process for uniformly doping second impurities W2 is performed, thereby transforming the first gate metal 130 on the second active fin 102 into a third gate metal 145 having a third work function which is different from a first work function.

Figure 20:
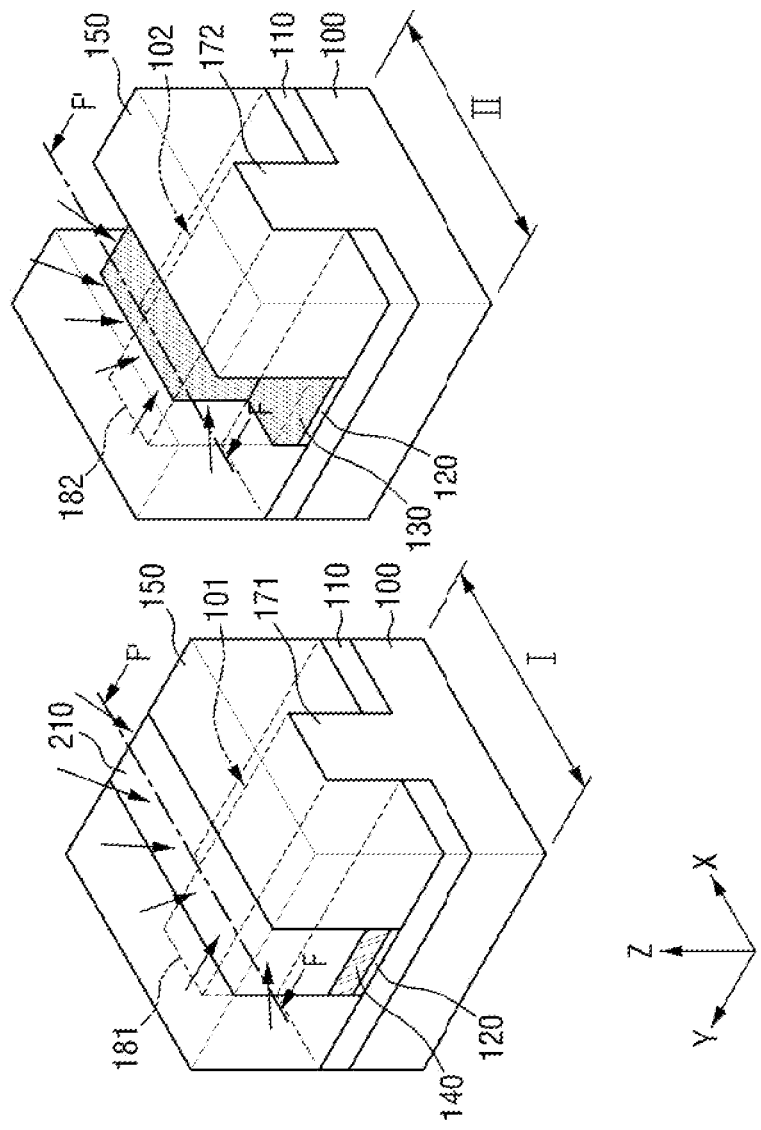
Figure 21:
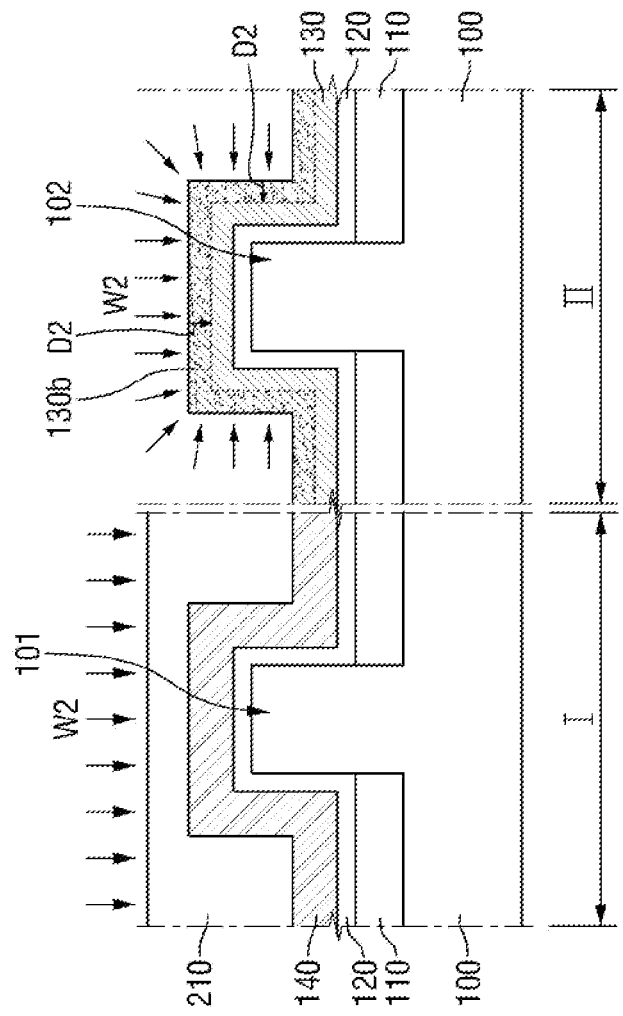

More specifically, referring to FIGS. 20 and 21, the second isotropic process is performed on the first region I and the second region II of the substrate 100. Here, since the second gate metal 140 formed on the first region I of the substrate 100 is covered with the second mask film 210 and the first gate metal 130 formed on the second region II of the substrate 100 is exposed by the second mask film 210, only the first gate metal 130 formed on the second region II of the substrate 100 is doped with the second impurities W2. That is, the second mask film 210 protects the second gate metal 140 formed on the first region I of the substrate 100 from the second impurities W2.

Characteristics of the second isotropic doping process may be the same as those of the first isotropic doping process described above. That is, the second isotropic doping process may be a process of doping the first gate metal 130 on the second active fin 102 with the second impurities W2 such that a doping profile 103b of the second impurities W2 within the first gate metal 130 is conformally formed along a profile of the first gate metal 130.

After the second isotropic doping process, a doping profile of the second impurities W2 on the side surfaces of the first gate metal 130 of the second active fin 102 and a doping profile of the second impurities W2 on the top surface of the first gate metal 130 of the second active fin 102 may be substantially the same. For example, a doping depth D2 of the second impurities W2 which is measured from the surface of the first gate metal 130 formed on a top surface of the second active fin 102 may be equal to (or differ less than 10%, or less than 20%, with) a doping depth D2 of the second impurities W2 which is measured from the surface of the first gate metal 130 formed on side surfaces of the second active fin 102. A peak doping concentration of the second impurities W2 on the side surfaces of the first gate metal 130 of the second active fin 102 and a peak doping concentration of the second impurities W2 on the top surface of the first gate metal 130 of the second active fin 102 may be substantially the same (e.g., vary within 10% or 20% of each other). The second isotropic doping process may be, for example, a plasma doping process using a plasma gas. Since the plasma doping process has been fully described above, a repetitive description thereof will be omitted.

In some embodiments, the second impurities W2 used in the second isotropic doping process may be a different material from the first impurities W1 (see FIG. 13) used in the first isotropic doping process described above. That is, the first gate metal 130 on the second active fin 102 may be doped with the second impurities W2 that are different from the first impurities W1 (see FIG. 13) contained in the second gate metal 140 on the first active fin 101.

In some embodiments, the second impurities W2 used in the second isotropic doping process may be the same as the first impurities W1 (see FIG. 13) used in the first isotropic doping process. However, they may be doped into the first gate metal 130 at different concentrations. That is, the second gate metal 140 on the first active fin 101 may be doped with the first impurities W1 (see FIG. 13) at a first concentration, and the first gate metal 130 on the second active fin 102 may be doped with the second impurities W2, which are the same as the first impurities W1 (see FIG. 13), at a second concentration different from the first concentration.

The second isotropic doping process may change the work function of the first gate metal 130 on the second active fin 102.

Figure 22:
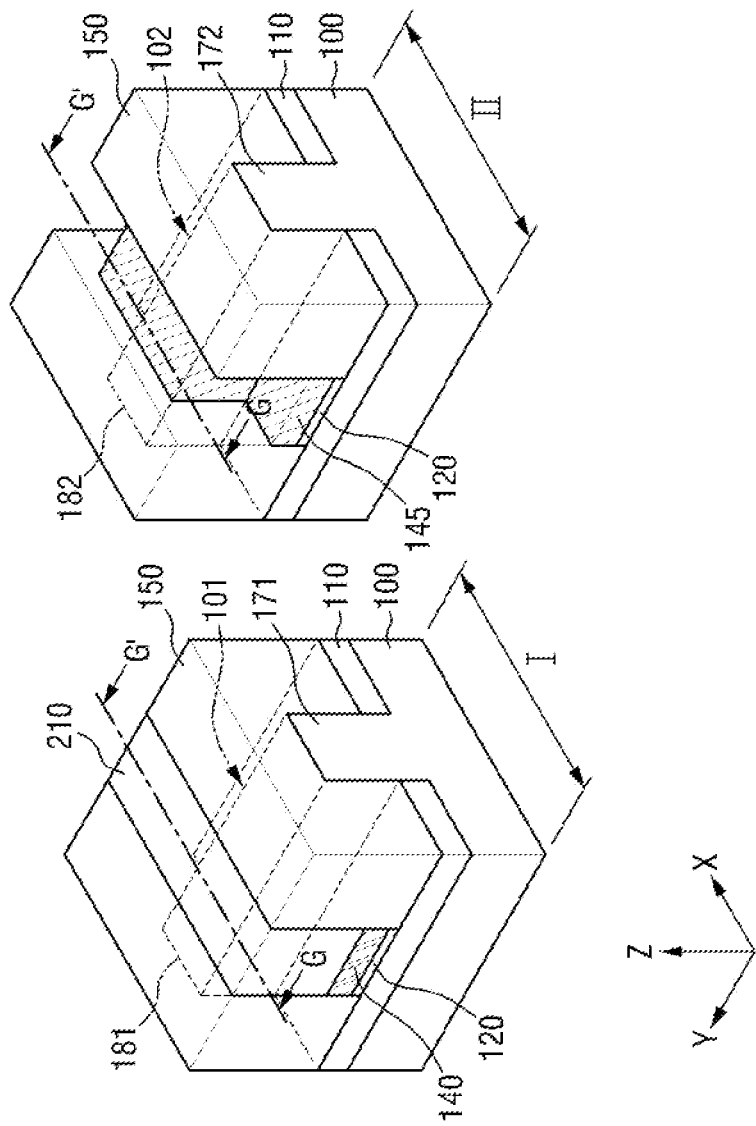
Figure 23:
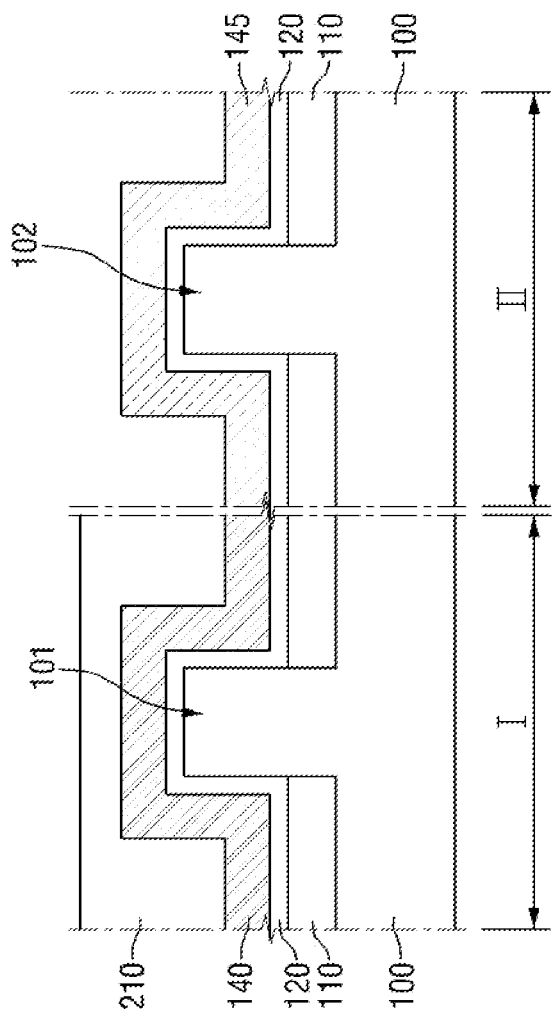

Referring to FIGS. 22 and 23, as a result of the second isotropic doping process, the second gate metal 140 having a second work function remains intact on the first active fin 101, whereas the third gate metal 145 (formed from the first gate metal 130) having the third work function is formed on the second active fin 102. The third work function may be different from the first work function of the first gate metal 130 (see FIG. 21). Particularly, in some embodiments, the third work function may be different from the first work function of the first gate metal 130 (see FIG. 21) and may be different from the second work function of the second gate metal 140 on the first active fin 101.

Therefore, in the current embodiment, first and second transistors having different threshold voltages in a different sense from those in the previous embodiment can be fabricated. This may result from the third gate metal 145 of the second transistor having the third work function which is different from the first work function of the first gate metal 130 (see FIG. 21) and/or the second work function of the second gate metal 140.

As alternative to the second embodiment described above with respect to FIGS. 2-23, the second mask film 210 (step S160) may be omitted. Thus, during the second isotropic doping (step S170), both the second gate metal 140 on the first active fin 101 and the first gate metal 130 on the second active fin 102 may be doped with the second impurities W2. Impurities W2 may be the same or different from impurities W1 (e.g., same or different atomic elements). Thus, the first gate metal 130 on the second active fin 102 may form a third gate metal 145 and the second gate metal 140 on the first active fin 101 may form a fourth gate metal. The third gate metal and fourth gate metal may have different work functions, which may result in different threshold voltages even when the transistors have the same size and structure (other than their gate metal materials). In this alternative, the order of the first isotropic doping (S150) and the second isotropic doping (step S170) may be switched so that both gate metals on the first and second active fins 101 and 102 are concurrently doped with a first isotropic doping followed by a selective isotropic doping (e.g., where only one of the gate metals on the first and second active fins 101 and 102 are doped). Isotropically doping both gate metals on the first and second active fins 101 and 102 may be performed prior to selectively isotropically doping only one (or at a reduced amount) of the gate metals of either the first or second active fins 101 and 102.

Hereinafter, a method of fins a semiconductor device according to another embodiment of the present inventive concept will be described with reference to FIGS. 2, 3, and 24 through 29.

Figure 24:
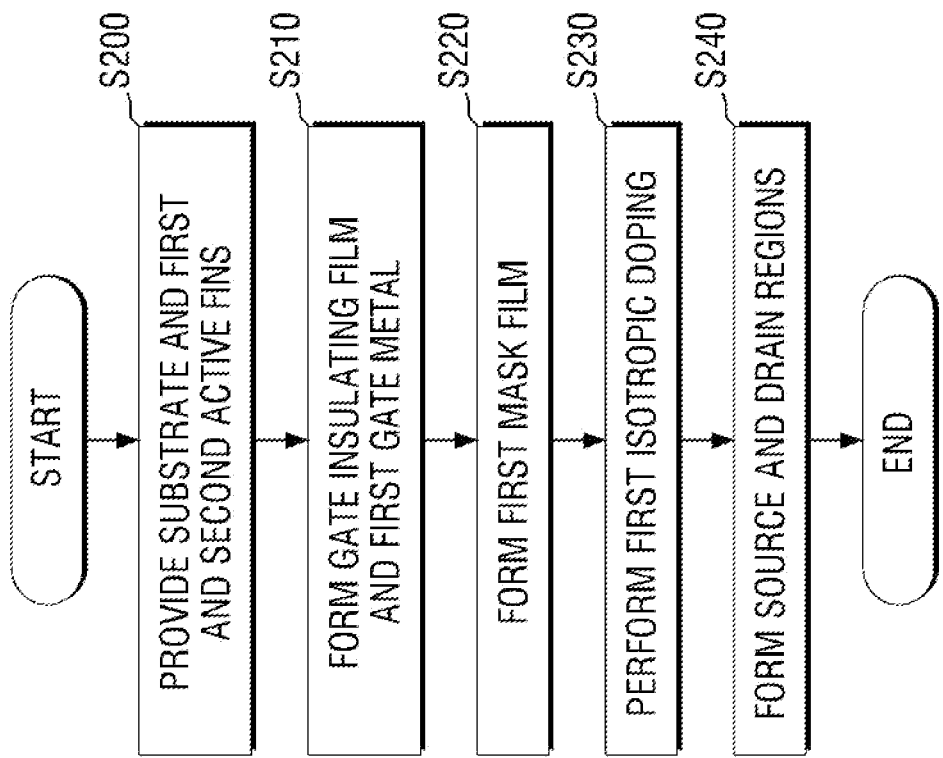
FIG. 24 is a flowchart illustrating a method of fabricating a semiconductor device according to another embodiment of the present inventive concept.

FIG. 24 is a flowchart illustrating a method of fabricating a semiconductor device according to another embodiment of the present inventive concept. FIGS. 25 through 29 are views illustrating intermediate processes included in the fabrication method of FIG. 24.

Referring to FIGS. 2, 3 and 24, a substrate 100 and first and second active fins 101 and 102 are provided (operation S200). Specifically, referring to FIGS. 2 and 3, the substrate 100 including a first region I and a second region II is prepared, and the first and second active fins 101 and 102 are formed by patterning a predetermined region of the substrate 100. Since this has been described above in detail, a repetitive description thereof will be omitted.

Figure 25:
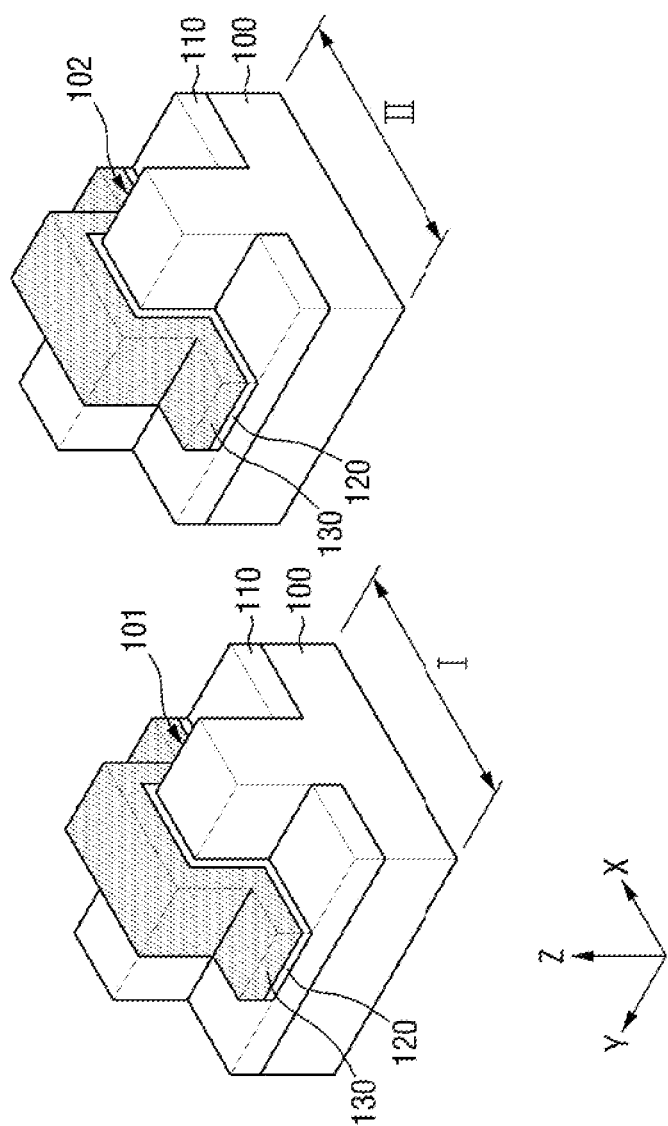
FIGS. 25 through 29 are views illustrating intermediate processes included in the fabrication method of FIG. 24.

Referring to FIGS. 24 and 25, a gate insulating film 120 and a first gate metal 130 are formed (operation S210). Specifically, referring to FIG. 25, an insulating layer (not shown) and a conductive layer (not shown) are sequentially stacked on the substrate 100 and each of the first and second active fins 101 and 102 and then patterned to form the gate insulating film 120 and the first gate metal 130 having a first work function as shown in FIG. 25.

Figure 26:
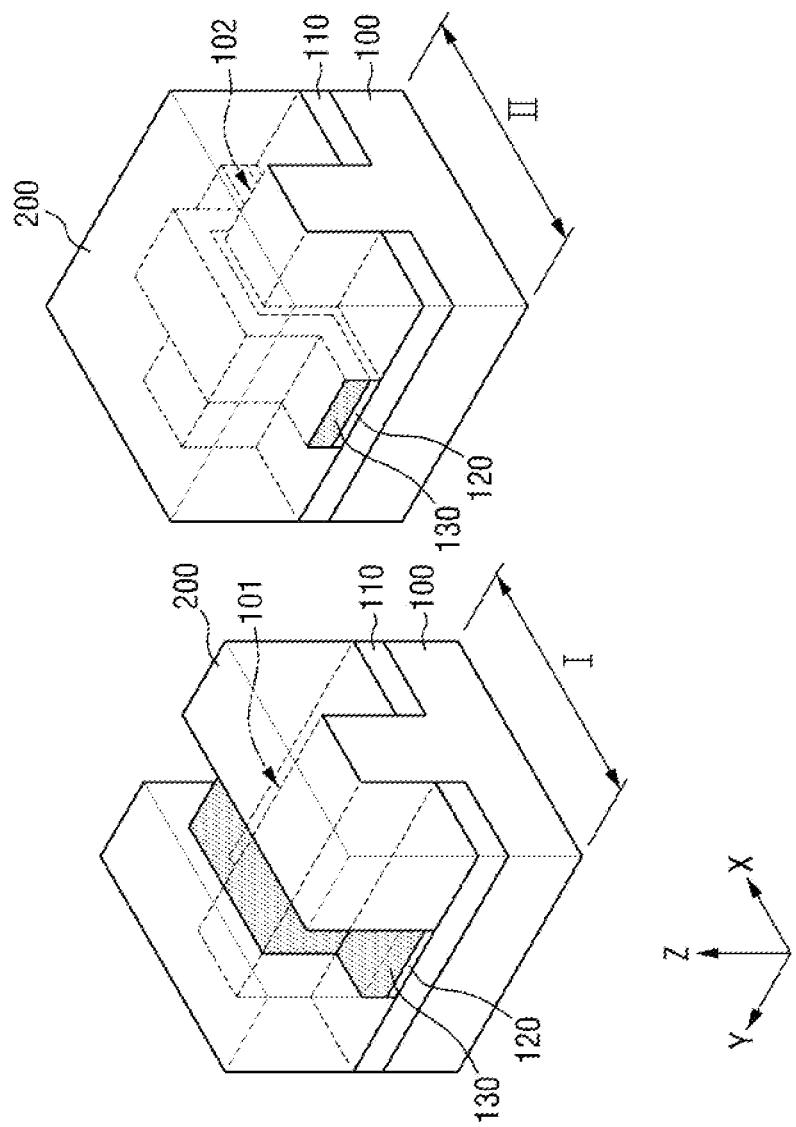

Referring to FIGS. 24 and 26, a first mask film 200 is formed (operation S220). Specifically, referring to FIG. 26, the first mask film 200 may be formed to expose the first gate metal 130 on the first active fin 101 and to cover the first gate metal 130 on the second active fin 102.

Figure 27:
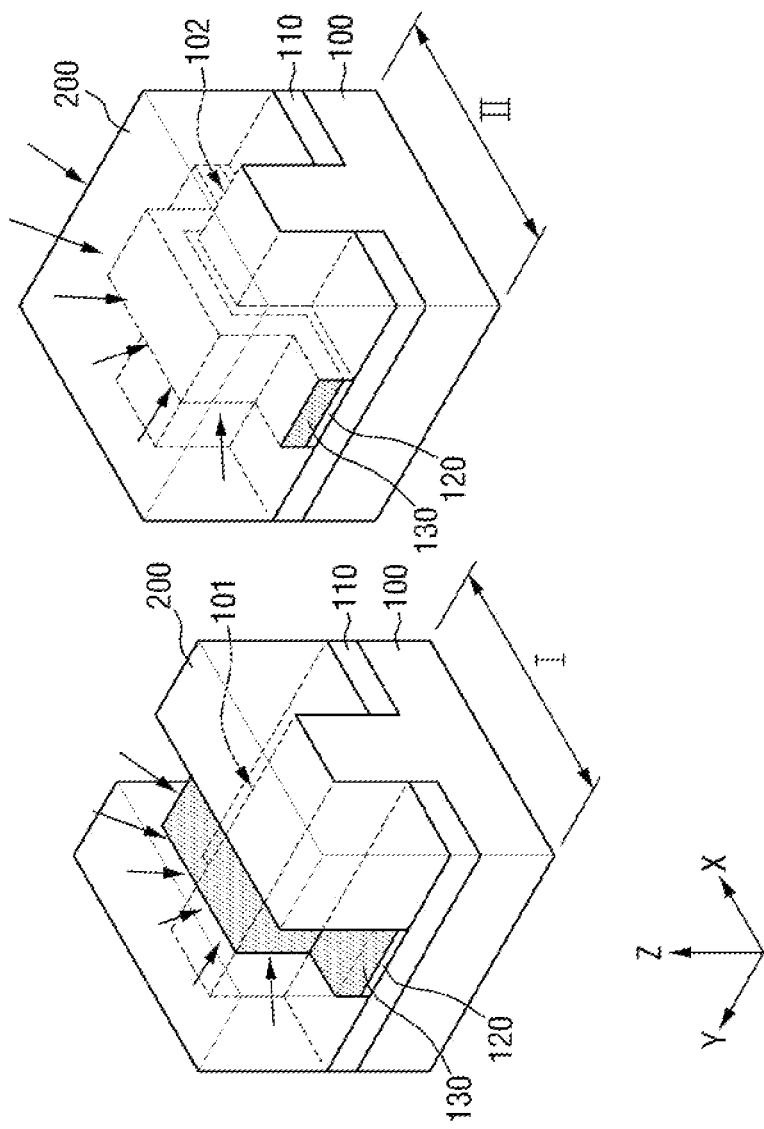
Figure 28:
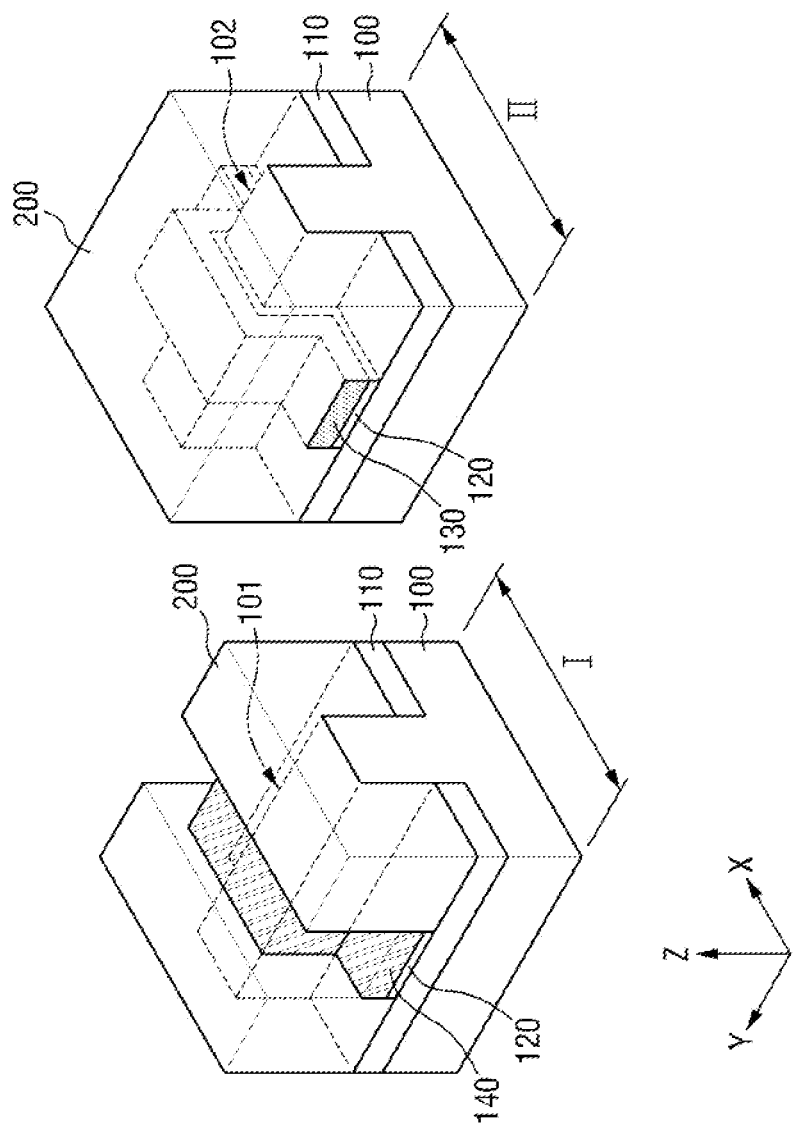

Referring to FIGS. 24, 27 and 28, a first isotropic doping process is performed (operation S230). Specifically, referring to FIGS. 27 and 28, the first isotropic doping process for doping impurities into the entire surface of the first gate metal 130 on the first active fin 101 is performed, thereby transforming the first gate metal 130 on the first active fin 101 into a second gate metal 140 having a second work function which is different from the first work function. Since this has been fully described above in detail, a repetitive description thereof will be omitted.

Figure 29:
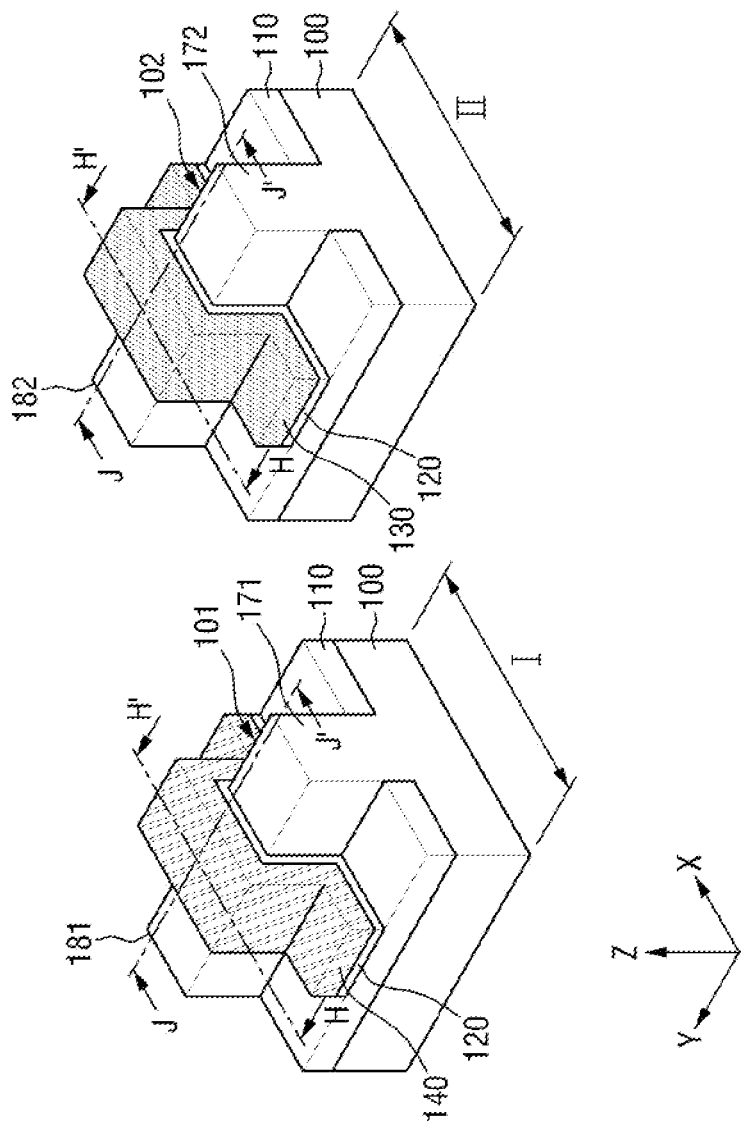

Referring to FIGS. 24 and 29, source and drain regions are formed on the substrate 100 (operation S240). Specifically, referring to FIG. 29, both sides of each of the first and second active fins 101 and 102 are exposed by removing the first mask film 200 (see FIG. 28) formed on the substrate 100, and N-type or P-type impurities are implanted into the exposed sides of each of the first and second active fins 101 and 102 (the same impurity type, either N or P, may be implanted into each of the first and second active fins 101 and 102), thereby forming first and second source regions 171 and 172 and first and second drain regions 181 and 182. That is, the current embodiment is different from the previous embodiment in that the first and second source regions 171 and 172 and the first and second drain regions 181 and 182 are formed after the formation of the first gate metal 130 in the current embodiment, whereas they may be formed before the formation of the first gate metal 130 in the previous embodiment. Both alternative sequences are applicable to all embodiments disclosed herein; the gate metal may be patterned (and possibly selectively doped) after formation of the source and drain regions (e.g., by doping the fins or substrate) or the gate metal may be patterned (and possibly selectively doped) before formation of the source and drain regions. In some example embodiments, when the source and drain regions are formed prior to formation of the gate metal, a dummy gate (like dummy gates 155') may be formed. The dummy gates may be used in these alternative embodiments to act as a mask when doping the first and second active fins (or planar substrate) when forming the source and drain regions of the first and second transistors. The dummy gates may be removed and the gate metal for the first and second transistors may be formed at the dummy gate locations, e.g., as described herein.

The gate metal may be selectively doped (either in both the first and second regions or one of the first and second regions) after or before the patterning of the gate metal. In addition, the formation of the source and drain regions may be interposed between the patterning of the gate metal and the selective doping of the gate metal (e.g., the sequence may be patterning the gate metal, formation of the source and drain regions, and then selective doping of the gate metal). In addition, embodiments contemplate selective doping of the gate metal (as described herein) concurrently (or at least partially concurrently) with the doping forming source and drain regions. That is, the selective doping of the gate metal may also dope the source and drain regions of at least one of the first and second transistors.

In a modified embodiment of the current embodiment, a second mask film (not shown) may be formed, and a second isotropic doping process may additionally be performed on the first gate metal 130 disposed on the second active fin 102. This process can be easily understood from the above description (see FIGS. 16-23 and associated description, e.g.), and thus a repetitive detailed description thereof will be omitted.

Hereinafter, a semiconductor device according to an embodiment of the present inventive concept will be described with reference to FIGS. 29 through 31.

Figure 30:
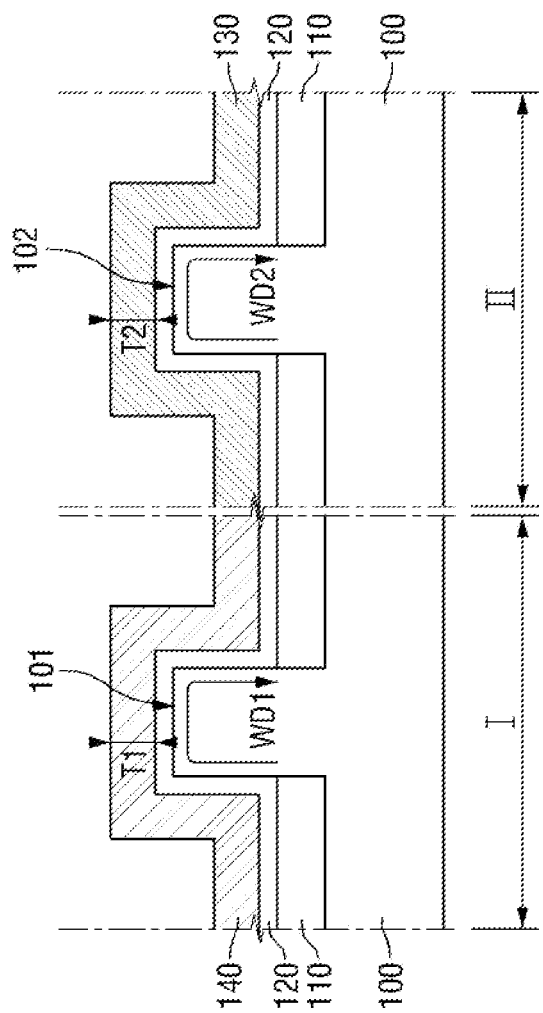
FIGS. 30 and 31 are cross-sectional views of a semiconductor device according to an embodiment of the present inventive concept.
Figure 31:
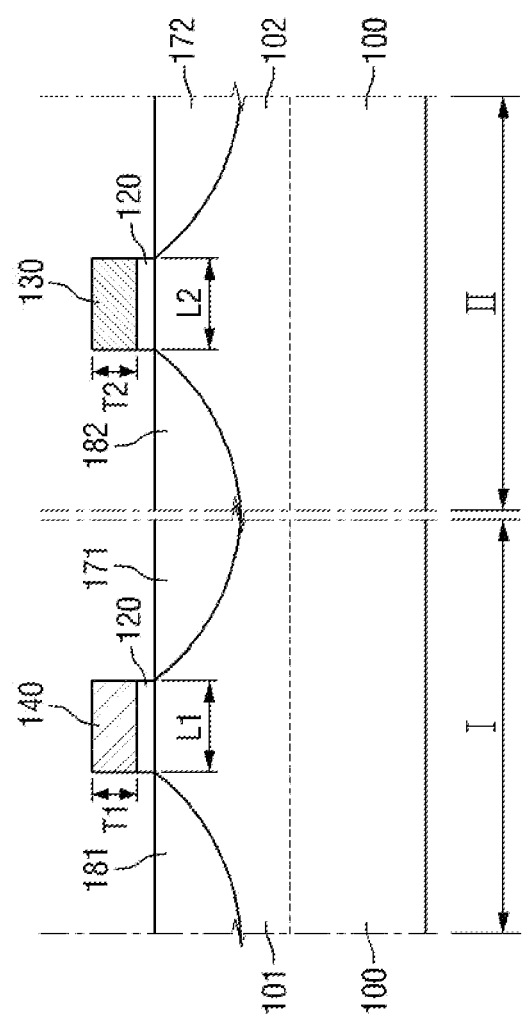

FIGS. 30 and 31 are cross-sectional views of a semiconductor device according to an embodiment of the present inventive concept. Specifically, FIG. 30 is a cross-sectional view taken along the line H-H' of FIG. 29. FIG. 31 is a cross-sectional view taken along the line J-J' of FIG. 29. For simplicity, typical components (such as an interlayer insulating film and a silicide film) of a transistor are not illustrated in FIGS. 29 through 31.

Referring to FIGS. 29 through 31, the semiconductor device may include a substrate 100, first and second active fins 101 and 102, an element isolation film 110, a gate insulating film 120, and first and second gate metals 130 and 140.

The substrate 100 may include a first region I and a second region II. The first and second active fins 101 and 102 may protrude at a top surface of the substrate 100 and may be integrally formed on the substrate 100. Specifically, as shown in the drawings, the first active fin 101 may protrude at a top surface of the first region I of the substrate 100 and may be integrally formed on the substrate 100, and the second active fin 102 may protrude at a top surface of the second region II of the substrate 100 and may be integrally formed on the substrate 100. As noted, the first and second active fins 101 and 102 may be formed by etching trenches into a substrate, or by epitaxially growth from the surface of a substrate.

In some embodiments, the first active fin 101 and the second active fin 102 may be doped with the same conductivity type. For example, both the first active fin 101 and the second active fin 102 may be N-doped. The N-type first and second active fins 101 and 102 may be formed by doping each of the first and second active fins 101 and 102 with N-type impurities or by forming an N-type well (not shown), which contains the N-type impurities, in each of the first and second active fins 101 and 102. Alternatively, both the first active fine 101 and the second active fin 102 may be P-doped.

In some other embodiments, the first active fin 101 and the second active fin 102 may be doped with different conductivity types. For example, the first active fin 101 may be N-doped, and the second active fin 102 may be P-doped.

The N-type first active fin 101 may be formed by doping the first active fin 101 with N-type impurities or by forming an N-type well (not shown), which contains the N-type impurities, in the first active fin 101. In addition, the P-type second active fin 102 may be formed by doping the second active fin 102 with P-type impurities or by forming a P-type well (not shown), which contains the P-type impurities, in the second active fin 101. Conversely, the first active fin 101 may be P-doped, and the second active fin 102 may be N-doped in the same way as described above.

First and second source regions 171 and 172 and first and second drain regions 181 and 182 may be formed in both sides of the first and second active fins 101 and 102, respectively. Specifically, the first source region 171 and the first drain region 181 may be formed in both sides of the first active fin 101, and the second source region 172 and the second drain region 182 may be formed in both sides of the second active fin 102. Here, the terms "source region" and "drain region" are used to distinguish them for ease of description. However, if the transistor shown in the drawings and another transistor (not shown) adjacent to the transistor share the source region and the drain region, the source region of the current embodiment may function as a drain region of the adjacent transistor, and the drain region of the current embodiment may function as a source region of the adjacent region. In addition, as is known, application of different voltages to a transistor may alter the function of a source region to that of a drain region, and the function of a drain region to that of a source region. To be clear, the present invention should not be limited by the terms "source region" and "drain region" as preventing other structure or functions (e.g., to require only source and drain functions).

The element isolation film 110 may be formed on both sides of each of the first and second fins 101 and 102. The element isolation film 110 may be made of, e.g., SiOx and may extend in a second direction (e.g., a Y direction) as shown in the drawings.

The gate insulating film 120 may be formed of, e.g., a high-k material on the element isolation film 110 and the first and second active fins 101 and 102. The high-k dielectric preferably may have a dielectric constant of 6 or greater. Alternatively, the high-k dielectric may have a dielectric constant of 8 or greater, larger than 10, or larger than 20. Various examples of high-k material have been provided above. In FIGS. 29 through 31, the gate insulating film 120 extends over the element isolation film 110 and the first and second active fins 101 and 102 in a third direction (e.g., an X direction). However, the present invention is not limited thereto. Optionally, the gate insulating film 120 may be formed only on the first and second active fins 101 and 102. In other words, the gate insulating film 120 may not be formed on the element isolation film 110 and may be formed only on the first and second active fins 101 and 102.

The first and second gate metals 130 and 140 may be formed on the gate insulating film 120. Specifically, the first and second gate metals 130 and 140 may be formed on the first and second active fins 101 and 102, respectively. In FIGS. 29 through 31, the second gate metal 140 is formed on the first active fin 101, and the first gate metal 130 is formed on the second active fin 102. However, this configuration can be changed as desired. That is, although not shown in the drawings, the first gate metal 130 can be formed on the first active fin 101, and the second gate metal 140 can be formed on the second active fin 102.

In the current embodiment, a thickness T1 of the second gate metal 140 formed on the first active fin 101 may be equal to a thickness T2 of the first gate metal 130 formed on the second active fin 102.

In addition, in the current embodiment, the first gate metal 130 and the second gate metal 140 may be made of the same metal. The material that forms the first and second gate metals 130 and 140 may be, but is not limited to, any one of metal, metal-carbide, metal-nitride, metal-silicide, and metal-silicon-nitride materials.

The first active fin 101, the first source region 171, the first drain region 181, the gate insulating film 120 on the first active fin 101, and the second gate metal 140 may form a first transistor. In addition, the second active fin 102, the second source region 172, the second drain region 182, the gate insulating film 120 on the second active fin 102, and the first gate metal 130 may form a second transistor. Therefore, a first channel may be formed in the first active fin 101 of the first transistor, and a second channel may be formed in the second active fin 102 of the second transistor.

In some embodiments, a length L1 of the first channel formed in the first active fin 101 may be equal to a length L2 of the second channel formed in the second active fin 102. In some embodiments, a width WD1 of the first channel formed in the first active fin 101 may be equal to a width WD2 of the second channel formed in the second active fin 102. In some other embodiments, the length L1 of the first channel formed in the first active fin 101 may be equal to the length L2 of the second channel formed in the second active fin 102, and the width WD1 of the first channel formed in the first active fin 101 may be equal to the width WD2 of the second channel formed in the second active fin 102. In the embodiments described herein, alternatives may include lengths L1 and L2 of the first and second channels (whether formed in the first and second active fins or as part of other transistors described herein) that are 20 nm or less.

In some embodiments, the first gate metal 130 may contain first impurities, and the second gate metal 140 may not contain the first impurities. In addition, the first gate metal 130 may contain the first impurities, and the second gate metal 140 may contain second impurities that are different from the first impurities. The first impurities and the second impurities may be doped respectively into the first and second gate metals 130 and 140 by, e.g., the above-described isotropic doping. Examples of the first and second impurities may include B, As, P, Si, Ge, Ar, He, and Xe. The first gate metal 130 may contain any one of B, As, P, Si, Ge, Ar, He and Xe, and the second gate metal 140 may contain a different one of B, As, P, Si, Ge, Ar, He and Xe (which is not contained in the first gate metal 130). The first gate metal 130 may contain one or more of B, As, P, Si, Ge, Ar, He and Xe, and the second gate metal 140 may share some or all of the impurities doped in the first gate metal and in addition, contain a different one or more of B, As, P, Si, Ge, Ar, He and Xe (which is not contained in the first gate metal 130).

Although the first gate metal 130 and the second gate metal 140 are described as formed from the same metal and having the same thickness and the first transistor and the second transistor have the same channel length or width, if the first gate metal 130 and the second gate metal 140 are doped with different impurities by, e.g., isotropic doping or if the first gate metal 130 only is doped with the first impurities, the first gate metal 130 and the second gate metal 140 may have different work functions. Accordingly, the first transistor and the second transistor may have different threshold voltages.

In some embodiments, the first gate metal 130 may contain impurities at a first concentration (or first doping profile), and the second gate metal 140 may contain impurities, which are the same as those contained in the first gate metal 130, at a concentration different (or at a second doping profile different from the first doping profile) from that of the impurities in the first gate metal 130. The first gate metal 130 may contain impurities at the first concentration, and the second gate metal 140 may contain the same impurities as those contained in the first gate metal 130 at a second concentration different from the first concentration. The impurities may be doped into the first and second gate metals 130 and 140 at different concentrations (and/or different doping profiles) by the above-described isotropic doping.

Although the first gate metal 130 and the second gate metal 140 are made of the same metal and have the same thickness and the first transistor and the second transistor have the same channel length or width, if the first gate metal 130 and the second gate metal 140 are doped with the same impurities at different concentrations by, e.g., isotropic doping, the first gate metal 130 and the second gate metal 140 may have different work functions. Accordingly, the first transistor and the second transistor may have different threshold voltages.

All embodiments described herein contemplate alternatives where the first gate metal 130 is formed of several layers of different metals (e.g., Ti/TiN/W stack of metal layers). In addition, each embodiment may be altered by providing different materials for the gate on the first active fin 101 and the gate the second active fin 102, such as different metals or additional materials as part of one of the gates but not as part of the other.

Hereinafter, a semiconductor device according to another embodiment will be described with reference to FIG. 32.

Figure 32:
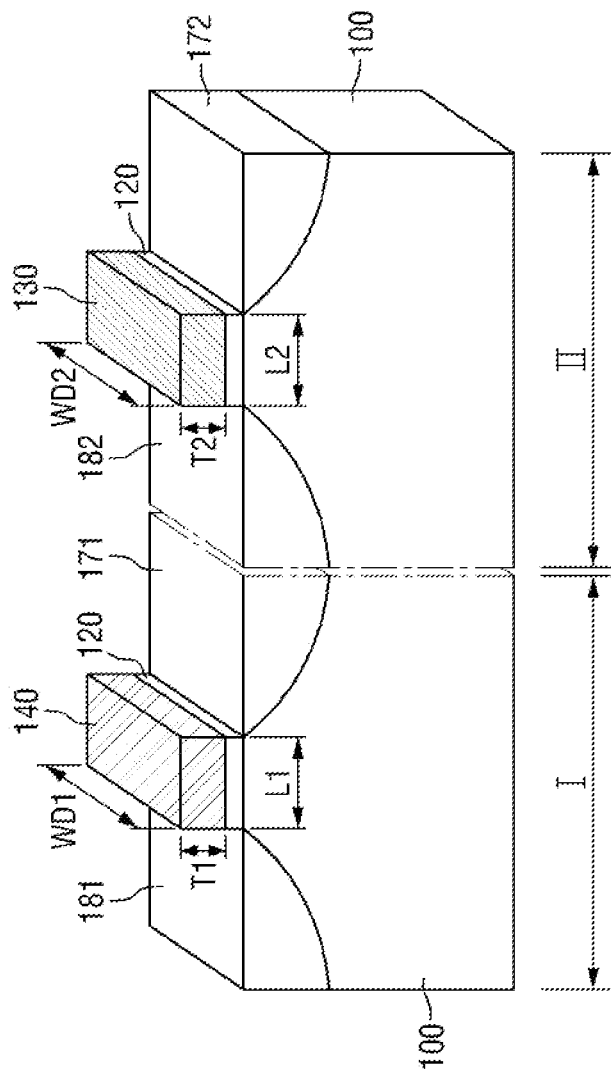
FIG. 32 is a partially cut perspective view of a semiconductor device according to another embodiment of the present inventive concept.

FIG. 32 is a partially cut perspective view of a semiconductor device according to another embodiment. For simplicity, a description of elements substantially identical to those of the previous embodiment described above will be omitted, and differences between the present and previous embodiments will mainly be described.

Referring to FIG. 32, in the current embodiment, a first transistor formed on a first region I of a substrate 100 and a second transistor formed on a second region II of the substrate 100 may have a planar structure.

That is, in the current embodiment, first and second active fins 101 and 102 (see, e.g., FIGS. 29 and 30) that protrude at a top surface of the substrate 100 and are integrally formed on the substrate 100 may not be formed. Instead, a gate insulating film 120 and first and second gate metals 130 and 140 may be formed directly on the substrate 100. The gate insulating film 120 and first and second gate metals 130 and 140 may have a planar structure. In addition, first and second source regions 171 and 172 and first and second drain regions 181 and 182 may be formed within the substrate 100 on both sides of the gate insulating film 120 and the first and second gate metals 130 and 140, respectively.

The first and second transistors may have a planar structure, such as shown in FIGS. 31 and 32 may also have different threshold voltages.

That is, the first gate metal 130 and the second gate metal 140 may be made of the same metal, and a thickness T1 of the second gate metal 140 formed on the first region I of the substrate 100 may be equal to a thickness T2 of the first gate metal 130 formed on the second region II of the substrate 100. In addition, a length L1 and width WD1 of a first channel formed in the first region I of the substrate 100 may be equal to a length L2 and width WD2 of a second channel formed in the second region II of the substrate 100. Even in this case, if the first gate metal 130 and the second gate metal 140 are doped with different impurities by, e.g., isotropic doping or by other doping processes, or if the first gate metal 130 only is doped with impurities and the second gate metal 140 is not doped with impurities, or if the first gate metal 130 and the second gate metal 140 are doped with different impurity concentrations and/or doping profiles, the first gate metal 130 and the second gate metal 140 may have different work functions. Accordingly, the first transistor and the second transistor may have different threshold voltages.

Under the same conditions, if the first gate metal 130 and the second gate metal 140 are doped with the same impurities at different concentrations by, e.g., isotropic doping, the first gate metal 130 and the second gate metal 140 may have different work functions. Accordingly, the first transistor and the second transistor may have different threshold voltages.

Hereinafter, a semiconductor device according to another embodiment will be described with reference to FIG. 33.

Figure 33:
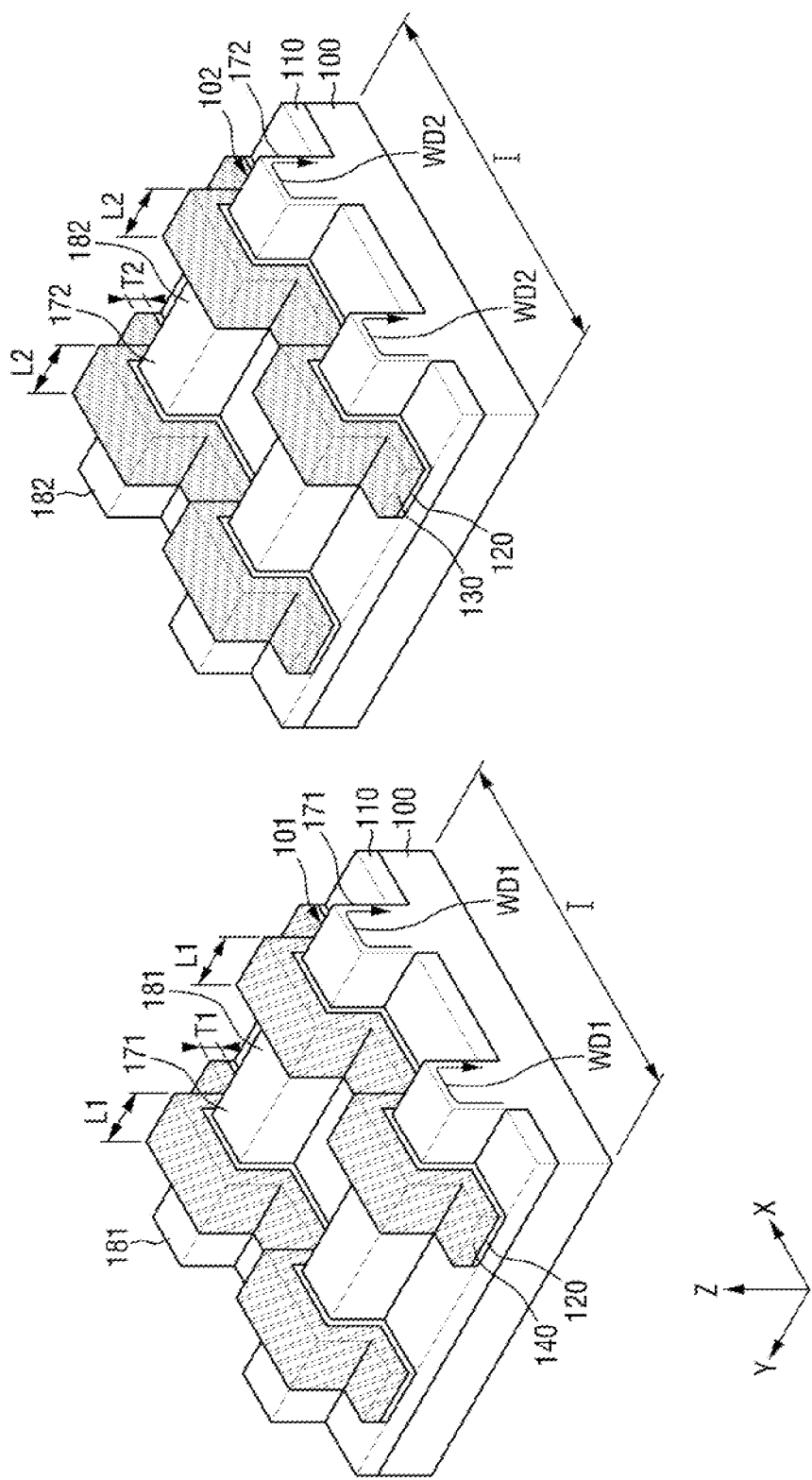
FIG. 33 is a perspective view of a semiconductor device according to another embodiment of the present inventive concept.

FIG. 33 is a perspective view of a semiconductor device according to another embodiment. For simplicity, a description of elements substantially identical to those of the previous embodiments described above will be omitted, and differences between the present and previous embodiments will mainly be described.

Referring to FIG. 33, a plurality of first active fins 101 and a plurality of second gate metals 140 may be formed on a first region I of a substrate 100, and a plurality of second active fins 102 and a plurality of first gate metals 130 may be formed on a second region II of the substrate 100. The first active fins 101 formed on the first region I of the substrate 100, a plurality of first source and drain regions 171 and 181, a plurality of gate insulating films 120 formed on the first region I of the substrate 100, and the second gate metals 140 may form a first transistor group. Likewise, the second active fins 102 formed on the second region II of the substrate 100, a plurality of source and drain regions 172 and 182, a plurality of gate insulating films 120 formed on the second region II of the substrate 100, and the first gate metals 130 may form a second transistor group.

As in the previous embodiments, in the current embodiment, the first transistor group and the second transistor group may also have different threshold voltages.

That is, the first gate metals 130 and the second gate metals 140 may be made of the same metal, and a thickness T1 of the second gate metals 140 formed on the first region I of the substrate 100 may be equal to a thickness T2 of the first gate metals 130 formed on the second region II of the substrate 100. In addition, a length L1 and width WD1 of a plurality of first channels formed in the first region I of the substrate 100 may be equal to a length L2 and width WD2 of a plurality of second channels formed in the second region II of the substrate 100. Even in this case, if the first gate metals 130 and the second gate metals 140 are doped with different impurities by, e.g., isotropic doping or if the first gate metals 130 only contain impurities, the first transistor group and the second transistor group may have different threshold voltages.

Under the same conditions, if the first gate metals 130 and the second gate metals 140 are doped with the same impurities at different concentrations by, e.g., isotropic doping, the first gate metals 130 and the second gate metals 140 may have different work functions. Accordingly, transistors of the first transistor group and transistors of the second transistor group may have different threshold voltages, even if these transistors are the same size and/or have the same channel lengths and channel widths.

Transistors of the first transistor group may be formed in a first well (such as a p-well or an n-well) formed in the substrate 100. Transistors of the second transistor group may be formed in the first well, or may be formed in a second well (such as a different p-well or n-well). The first and second wells may be of the same type (either both p-wells or both n-wells). The wells may constitute a doped portion of the substrate and may act to help isolate areas of the semiconductor substrate from each other (e.g., create a p-n junction at their boundaries with other portions of the substrate (doped with the opposite dopant type)).

While the present invention has been particularly shown and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

For example, in all embodiments, the first and second transistors (or transistors of the first and second transistor groups) have been shown to have the same orientation (e.g., fins running in a Y direction, gate metal lines running in an X direction, etc.). However, while such orientations may be beneficial in certain applications, the invention contemplates for all embodiments described herein that one or more of the transistors (and their elements) may be oriented in other directions. For example, the first transistor may be rotated 90 degrees with respect to the orientation of the second transistor. Similarly, transistors of the first transistor group (and transistors of the second transistor group) may have orientations different from one another.

As another example, the above FinFET embodiments describe first and second transistors formed on first and second active fins 101 and 102. However, all FinFet embodiments contemplate alternatives where the first and second transistors are formed on the same active fin.

As another example, all embodiments contemplate alternatives of selective epitaxially grown source and drain regions. For example, the channel region may be defined by etching into the substrate at locations corresponding to source and drain regions (e.g., using a mask, such as a dummy gate). The source and drain regions may then be epitaxially grown selectively at these etched locations. These source and drain regions may be epitaxially raised regions. The source and drain regions may be doped with by in-situ doping (by adding dopants to the precursor used in the epitaxial growth process) or may be later doped by other known methods. The embodiments described herein contemplate alternatives where the source and drain regions of the first and second transistors (or first and second transistor groups) may be epitaxially grown B-doped Si (e.g., when these transistors are NMOS transistors). The embodiments described herein contemplate alternatives where the source and drain regions of the first and herein transistors (or first and second transistor groups) may be epitaxially grown P-doped SiGe (e.g., when these transistors are PMOS transistors). Also, all embodiments contemplate an epitaxially grown channel region, whether as part of a FinFET or other types of transistors described herein. For further exemplary details of selective epitaxial growth of source and drain regions and/or channel regions, see U.S. Patent Publication 2010/0035398, the contents of which are incorporated by reference in their entirety.

EXPERIMENTAL EXAMPLE

A substrate and first and second active fins which protrude at a top surface of the substrate and integrally formed on the substrate were provided, and a gate insulating film was formed on each of the first and second active fins. Then, a gate metal made of TiN was formed on the gate insulating film.

The gate insulating film formed on the second active fin was masked, and a plasma doping process was performed on the exposed gate insulating film formed on the first active fin by using argon as impurities. In this state, a C-V curve of a first transistor Q including the exposed gate insulating film formed on the first active fin and a C-V curve of a second transistor P including the masked gate insulating film formed on the second active fin were obtained. While this experimental example conforms to the embodiment described with respect to FIGS. 2-15, the results may also exemplify all the embodiments described herein (although it should be emphasized that other results are of course contemplated for all embodiments as well). The results of the experiment are shown in FIG. 34.

Figure 34:
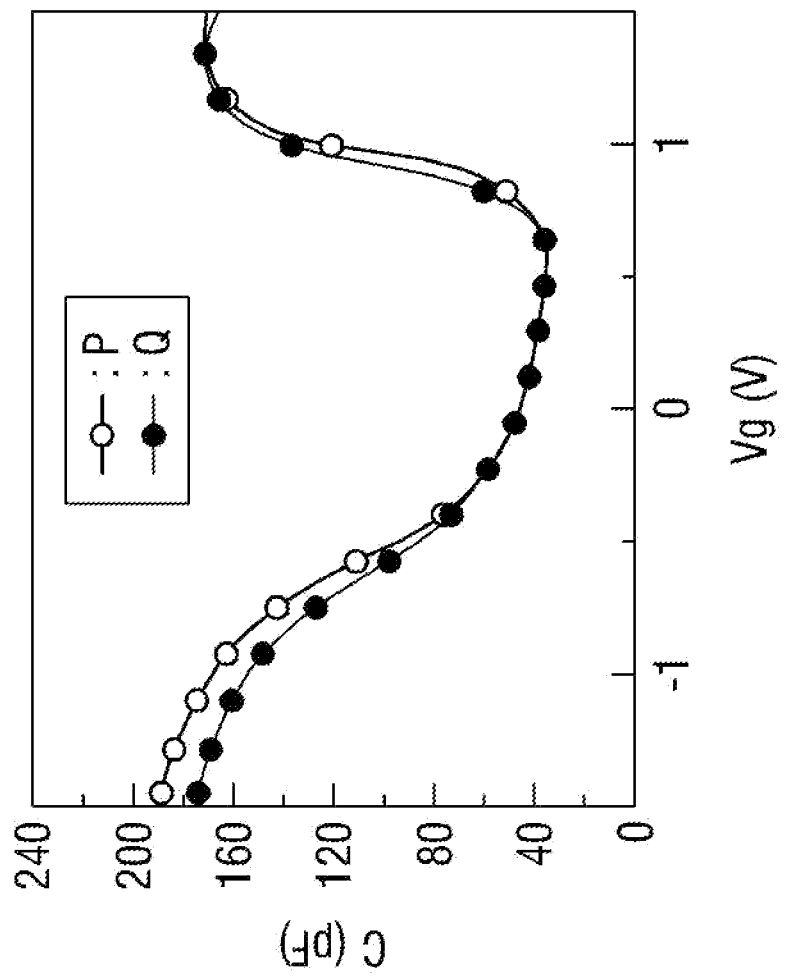
FIG. 34 is a diagram illustrating properties of a semiconductor device fabricated using a fabrication method according to embodiments of the present inventive concept.

Referring to FIG. 34, a threshold voltage of the first transistor Q is different from that of the second transistor P. Specifically, since the work function of the gate metal changes the C-V curve of the first transistor Q is shifted to the left from the C-V curve of the second transistor P. In particular, the shift is greater in a region (e.g., an operation region of an NMOS transistor) in which a gate voltage Vg has a negative value than in a region (e.g., an operation region of a p-channel metal oxide semiconductor (PMOS) transistor) in which the gate voltage Vg has a positive value.

It can be understood from the above experimental results that the method of fabricating a semiconductor device according to the embodiments of the present inventive concept can be used to adjust threshold voltages of transistors in a reliable manner.

What is claimed is:

1. A method of fabricating a semiconductor device comprising:
   providing a substrate and a first active fin and a second active fin on the substrate;
   forming first source and drain regions in the first active fin and second source and drain regions in the second active fin;
   forming a first gate insulating film on the first active fin and a second gate insulating film on the second active fin;
   forming a first gate material on the first gate insulating film and a second gate material on the second gate insulating film, wherein each of the first gate material and the second gate material has a first work function;
   forming a first mask film on the second gate material to expose the first gate material and cover the second gate material; and
   performing a first isotropic doping process such that the first gate material has a second work function different from the first work function and the second gate material has the first work function, wherein the first source and drain regions and the second source and drain regions are of a same conductivity.

2. The method of fabricating the semiconductor device of claim 1, wherein during the first isotropic doping process, the first gate material is doped with first impurities and the second gate material is not doped with the first impurities.

3. The method of fabricating the semiconductor device of claim 1, wherein during the first isotropic doping process, the first gate material is doped with a first amount of first impurities and the second gate material is doped with a second amount of the first impurities, and wherein the first amount is different from the second amount.

4. The method of fabricating the semiconductor device of claim 1, wherein during the first isotropic doping process, first impurities are doped into an entire surface of the first gate material.

5. The method of fabricating the semiconductor device of claim 4, wherein after the first isotropic doping process, a doping profile of the first impurities within the first gate material is conformally formed along a profile of the first gate material.

6. The method of fabricating the semiconductor device of claim 1, further comprising:
   removing the first mask film on the second gate material;
   forming a second mask film on the first gate material to expose the second gate material and cover the first gate material; and
   performing a second isotropic doping process such that the second gate material has a third work function different from the first work function and the first gate material has the second work function.

7. The method of fabricating the semiconductor device of claim 6, wherein the third work function is different from the second work function.

8. The method of fabricating the semiconductor device of claim 6, wherein during the first isotropic doping process, the first gate material is doped with first impurities and the second gate material is not doped with the first impurities, and during the second isotropic doping process, the second gate material is doped with second impurities and the first gate material is not doped with the second impurities.

9. The method of fabricating the semiconductor device of claim 8, wherein the first impurities are different from the second impurities.

10. The method of fabricating the semiconductor device of claim 8, wherein the first impurities are a same type as the second impurities, and during the first isotropic doping process, the first gate material is doped with the first impurities at a first concentration, and during the second isotropic doping process, the second gate material is doped with the second impurities at a second concentration different from the first concentration.

11. The method of fabricating the semiconductor device of claim 6, wherein during the second isotropic doping process, the second gate material is doped with a first amount of second impurities and the second gate material is doped with a second amount of the second impurities, and wherein the first amount is different from the second amount.

12. The method of fabricating the semiconductor device of claim 11, wherein during the first isotropic doping process, the first gate material is doped with first impurities and the second gate material is not doped with the first impurities.

13. The method of fabricating the semiconductor device of claim 6, wherein during the first isotropic doping process, the first gate material is doped with a first amount of first impurities and the second gate material is doped with a second amount of the first impurities, the first amount is different from the second amount, and during the second isotropic doping process, the second gate material is doped with second impurities and the first gate material is not doped with the second impurities.

14. The method of fabricating the semiconductor device of claim 6, wherein during the first isotropic doping process, first impurities are doped into an entire surface of the first gate material, and during the second isotropic doping process, the second impurities are doped into an entire surface of the second gate material.

15. The method of fabricating the semiconductor device of claim 14, wherein after the first isotropic doping process, a doping profile of the first impurities within the first gate material is conformally formed along a profile of the first gate material, and after the second isotropic doping process, a doping profile of the second impurities within the second gate material is conformally formed along a profile of the second gate material.

16. A method of fabricating a semiconductor device, the method comprising:
providing a first active fin and a second active fin on a substrate;
forming first source and drain regions in the first active fin and second source and drain regions in the second active fin;
forming a first gate insulating film on the first active fin and a second gate insulating film on the second active fin;
forming a first gate material on the first gate insulating film and a second gate material on the second gate insulating film, wherein each of the first gate material and the second gate material has a first work function;
forming a first mask film on the second gate material to expose the first gate material and cover the second gate material;
performing a first isotropic doping process such that the first gate material has a second work function different from the first work function and the second gate material has the first work function, wherein during the first isotropic doping process, the first gate material is doped with a first amount of first impurities and the second gate material is doped with a second amount of the first impurities, and wherein the first amount is different from the second amount;
removing the first mask film from the second gate material;
forming a second mask film on the first gate material to expose the second gate material and cover the first gate material; and
performing a second isotropic doping process such that the second gate material has a third work function different from the first work function and the first gate material has the second work function, wherein during the second isotropic doping process, the second gate material is doped with second impurities and the first gate material is not doped with the second impurities.

17. The method of fabricating the semiconductor device of claim 16, wherein during the first isotropic doping process, the first impurities are doped into an entire surface of the first gate material, and during the second isotropic doping process, the second impurities are doped into an entire surface of the second gate material.

18. The method of fabricating the semiconductor device of claim 16, wherein during the second isotropic doping process, the second gate material is doped with a first amount of the second impurities and the second gate material is doped with a second amount of the second impurities, and wherein the first amount of the second impurities is different from the second amount of the second impurities.

19. The method of fabricating the semiconductor device of claim 16, wherein forming the first source and drain regions in the first active fin and forming the second source and drain regions in the second active fin further includes:
forming the first source and drain regions in both sides of the first active fin; and
forming the second source and drain regions in both sides of the second active fin.

20. A method of fabricating a semiconductor device comprising:
providing a first active fin and a second active fin on a substrate;
forming first source and drain regions in the first active fin and second source and drain regions in the second active fin;
forming a first gate insulating film on the first active fin and a second gate insulating film on the second active fin;
forming a first gate material on the first gate insulating film and a second gate material on the second gate insulating film, wherein each of the first gate material and the second gate material has a first work function;
forming a first mask film on the second gate material to expose the first gate material and cover the second gate material;
performing a first isotropic doping process such that the first gate material has a second work function different from the first work function and the second gate material has the first work function, wherein during the first isotropic doping process the first gate material is doped with first impurities at a first concentration and the second gate material is not doped with the first impurities;

removing the first mask film on the second gate material;

forming a second mask film on the first gate material to expose the second gate material and cover the first gate material; and performing a second isotropic doping process such that the second gate material has a third work function different from the first work function and the first gate material has the second work function, wherein during the second isotropic doping process the second gate material is doped with second impurities at a second concentration different from the first concentration and the first gate material is not doped with the second impurities, and wherein the first impurities are a same type as the second impurities.

* * * * *